(12) United States Patent
Kuo et al.

(10) Patent No.: US 12,708,012 B2
(45) Date of Patent: Aug. 11, 2026

(54) PACKAGE STRUCTURE

(71) Applicant: Advanced Semiconductor Engineering, Inc., Kaohsiung (TW)

(72) Inventors: Chun Fu Kuo, Kaohsiung (TW); Shang Min Chuang, Kaohsiung (TW); Ching Hung Chuang, Kaohsiung (TW); Hsu Feng Tseng, Kaohsiung (TW); Jia Zhen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 760 days.

(21) Appl. No.: 17/993,798

(22) Filed: Nov. 23, 2022

(65) Prior Publication Data

US 2024/0170437 A1 May 23, 2024

(51) Int. Cl.

| | |
|---|---|
| ***H01L 23/00*** | (2006.01) |
| ***H10W 70/67*** | (2026.01) |
| ***H10W 70/68*** | (2026.01) |
| ***H10W 90/00*** | (2026.01) |
| *H10W 70/60* | (2026.01) |
| *H10W 72/00* | (2026.01) |
| *H10W 72/30* | (2026.01) |
| *H10W 74/15* | (2026.01) |

(52) U.S. Cl.

CPC ......... *H10W 70/688* (2026.01); *H10W 70/68* (2026.01); *H10W 90/00* (2026.01); *H10W 70/60* (2026.01); *H10W 70/681* (2026.01); *H10W 72/07354* (2026.01); *H10W 72/342* (2026.01); *H10W 72/387* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | | |
|---|---|---|---|---|
| 6,519,844 | B1 * | 2/2003 | Nagarajan | H01L 24/32 29/841 |
| 8,228,682 | B1 * | 7/2012 | Zohni | H01L 21/563 257/737 |
| 11,362,068 | B2 * | 6/2022 | Park | H01L 24/32 |
| 11,894,338 | B2 * | 2/2024 | Park | H01L 24/94 |
| 11,901,339 | B2 * | 2/2024 | Park | H01L 25/0657 |
| 11,948,896 | B2 * | 4/2024 | Tsai | H01L 21/78 |
| 2011/0115083 | A1 | 5/2011 | Zang et al. | |
| 2023/0066598 | A1 * | 3/2023 | Lai | H01L 23/3135 |

* cited by examiner

*Primary Examiner* — Long Pham

(74) *Attorney, Agent, or Firm* — Foley and Lardner LLP

(57) ABSTRACT

A package structure is disclosed. The package structure includes a first substrate, a second substrate, a gap, and a directing structure. The second substrate is disposed under the first substrate. The gap is between the first substrate and the second substrate. The gap includes a first region and a second region. The first region is configured to accommodate a filling material. The directing structure is disposed in a flow path of the filling material and configured to reduce a migration of the filling material from the first region to the second region.

16 Claims, 19 Drawing Sheets

PACKAGE STRUCTURE

BACKGROUND

1. Field of the Disclosure

The present disclosure relates to a package structure, and in particular a package structure including a trench in a carrier.

2. Description of the Related Art

Underfill material is normally used when the flip-chip bonding a device to a carrier in a package structure. The packaging structure may have a portion which will be bent. However, underfill material may overflow onto the portion to be bent. Once the underfill material is cured, the flexibility of the packaging structure is significantly reduced.

SUMMARY

In some embodiments, a packaging structure includes a first substrate, a second substrate, a gap, and a directing structure. The second substrate is disposed under the first substrate. The gap is between the first substrate and the second substrate. The gap includes a first region and a second region. The first region is configured to accommodate a filling material. The directing structure is disposed in a flow path of the filling material and configured to reduce a migration of the filling material from the first region to the second region.

In some embodiments, a packaging structure includes a substrate, a carrier, a filling material, and an adhesion enhancement structure. The carrier is disposed under the substrate and has a first upper surface facing the substrate. The filling material is disposed between the substrate and the first upper surface of the carrier. The adhesion enhancement structure is disposed on the first upper surface of the carrier and configured to reduce an extent of delamination between the filling material and the first upper surface of the carrier.

In some embodiments, a packaging structure includes a substrate, a carrier, a gap, and a directing structure. The substrate includes a first portion having a first value of flexural modulus and a second portion having a second value of flexural modulus smaller than the first value of flexural modulus. The carrier is disposed under the substrate. The gap is between the substrate and the carrier. The directing structure is disposed in the gap. The directing structure is located between the first portion and the second portion of the substrate from a top view.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
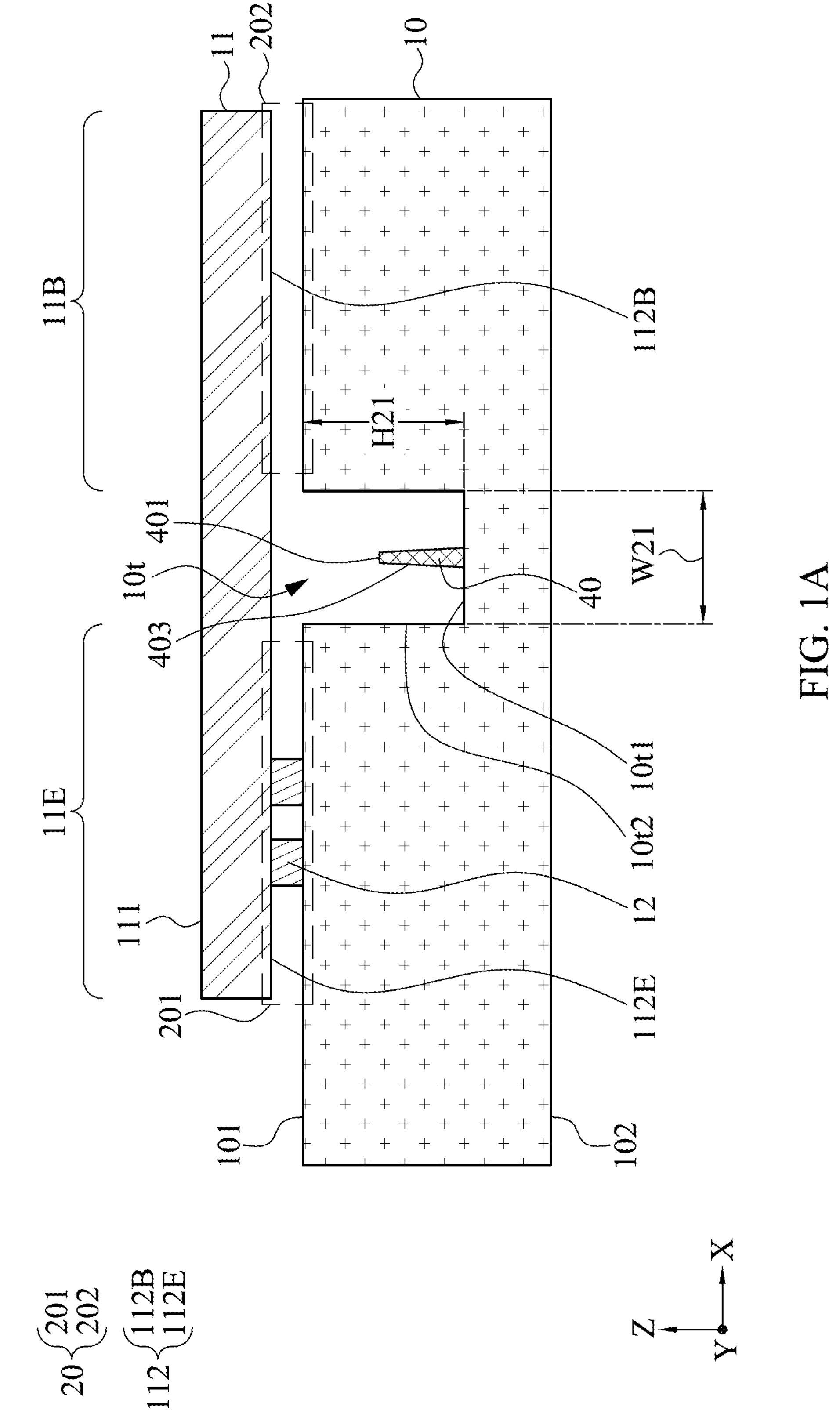
FIG. 1A is a cross-sectional view of an exemplary package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for purposes of simplicity and clarity and does not in itself dictate a relationship between the various embodiments and/or configurations discussed.

Figure 1B:
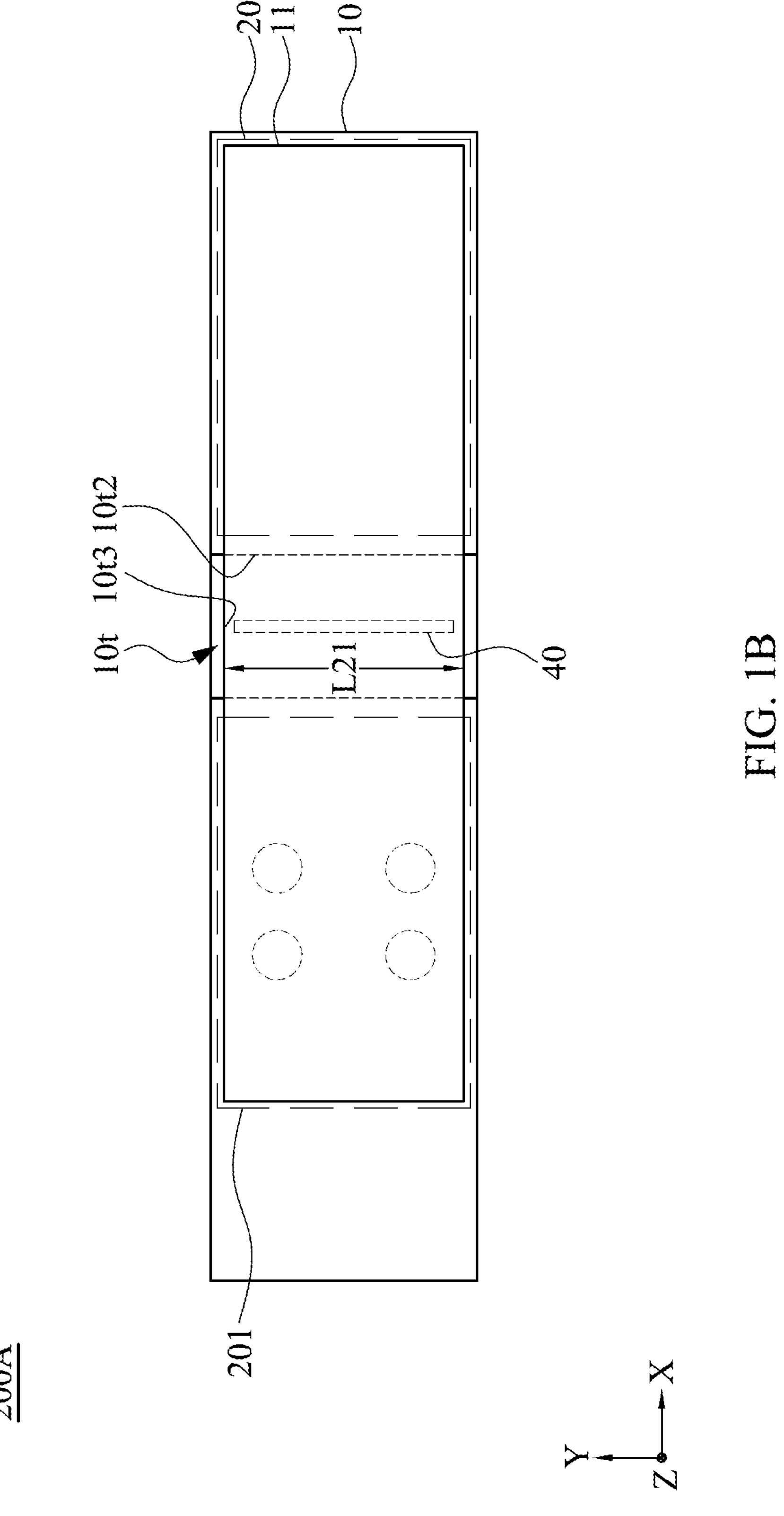
FIG. 1B is a top view of an exemplary package structure according to some embodiments of the present disclosure.

FIG. 1A is a cross-sectional view of an exemplary package structure 200A according to some embodiments of the present disclosure. FIG. 1B is a top view of the package structure 200A according to some embodiments of the present disclosure. The package structure 200A may include a carrier (or a substrate) 10, a substrate 11, a connection element 12, and a directing structure (or a microstructure) 40. In some embodiments, the directing structure refers to a flow directing structure.

The carrier 10 may be disposed below the substrate 11. The carrier 10 may be disposed under the substrate 11. The carrier 10 may have a surface (or an upper surface) 101 and a surface 102 opposite thereto. In some embodiments, the surface 101 may be referred as an upper surface of the carrier 10. In some embodiments, the surface 102 may be referred as a lower surface of the carrier 10. The surface 101 of the carrier 10 may face the substrate 11. The surface 101 of the carrier 10 may include a circuit layer or a conductive pad (not shown) connected to the connection element 12. The carrier 10 may be electrically connected to the substrate 11 via the connection element 12. In some embodiments, the carrier 10 may include a lead frame encapsulated by molding compounds. In some embodiments, the carrier 10 may include, for example, a printed circuit board (PCB), such as a paper-based copper foil laminate, a composite copper foil laminate, or a polymer-impregnated glass-fiber-based copper foil laminate. In some embodiments, the carrier 10 may include a semiconductor substrate including silicon, germanium, or other suitable materials.

The substrate 11 may be disposed above the carrier 10. The substrate 11 may have a surface 111 and a surface 112 opposite thereto. In some embodiments, the surface 111 may be referred as an upper surface of the substrate 11. In some embodiments, the surface 112 may be referred as a lower surface of the substrate 11. The surface 112 may face the carrier 10. The substrate 11 may include a lead frame encapsulated by molding compounds. In some embodiments, the substrate 11 may include, for example, a printed circuit board (PCB), such as a paper-based copper foil laminate, a composite copper foil laminate, or a polymer-impregnated glass-fiber-based copper foil laminate. In some embodiments, the carrier 10 may include a semiconductor substrate including silicon, germanium, or other suitable materials. In some embodiments, the substrate 11 may include one or more semiconductor chips (or dies), an integrated circuit, and active or passive components.

In some embodiments, the surface 112 of the substrate 11 may include a circuit layer or a conductive pad (not shown) connected to the connection element 12. In some embodiments, the substrate 11 may be a pliable or flexible substrate. For example, the substrate 11 (or at least a portion of the substrate 11) may be bendable, twistable, and/or stretchable. The substrate 11 may include a pliable material, a flexible material, or a soft material. For example, the substrate 11 may be or include a resin-based substrate. In some embodiments, the substrate may be or include a flexible printed circuit board (PCB). The substrate 11 may have a portion 11B. The portion 11B may be used for bending, and thus can be referred as "portion to be bent 11B" The portion 11B may be more bendable than other portions of the substrate 11. The substrate 11 may have a portion 11E. The portion 11E may have a smaller curvature than that of the portion 11B when the package structure 200A is bent. The portion 11E may have a first value of flexural modulus. The portion 11B may have a second value of flexural modulus smaller than the first value of flexural modulus. The flexural modulus may defined as the ratio of stress to strain in flexural deformation has a unit, e.g., "Pa.". The flexural modulus may be defined as the tendency for a material to resist bending. That is, the higher a value of flexural modulus of a material is, the smaller anti-deformation capacity (i.e., corresponding smaller deformation and/or higher stress) it has. In some embodiments, the higher first value of flexural modulus indicates that the tendency of the portion 11E to resist bending is less than the portion 11B.

The connection element 12 may be disposed between the portion 11E of the substrate 11 and the carrier 10. The connection element 12 may be electrically connected to the substrate 11 and/or the carrier 10. The connection element 12 may include, for example, a solder ball or a controlled collapse chip connection (C4) bump.

The carrier 10 (or the surface 101) and the substrate 11 (or the surface 112) may define a gap 20 therebetween. The gap 20 may include a region 201 between the portion 11E of the substrate 11 and the carrier 10 and region 202 between the portion 11B of the substrate 11 and the carrier 10. The region 201 may be located below the portion 11E of the substrate 11. The region 202 may be located below the portion 11B of the substrate 11. The region 201 may be located under the portion 11E of the substrate 11. The region 202 may be located under the portion 11B of the substrate 11. In some embodiments, the region 201 of the gap 20 is configured to accommodate a filling material 30 and the region 202 of the gap 20 is free from the filling material 30 (see FIG. 2A and FIG. 2B).

In some embodiments, the carrier 10 includes a first region, a second region and a recess and the second region is spaced apart from the first region by the recess. In some embodiments, the first region and second region of the carrier 10 may respectively correspond to the region 201 and region 202, and the recess may correspond to the trench **10*t*** (discussed below).

The carrier 10 may include a trench **10*t* (or a groove) recessed from the surface 101 of the carrier 10. The trench 10*t* may be located below the substrate 11. The trench 10*t* may be located under the substrate 11. The trench 10*t* may have a surface (or a bottom surface or an inner surface) 10*t*1, lateral surfaces 10*t*2, and lateral surfaces 10*t*3. The surface 10*t*1 may face the substrate 11. The surface 10*t*1 may be referred to as an upper surface of the carrier 10 which is located at a lower elevation than the surface 101 thereof. The lateral surfaces 10*t*2 may be connected to the lateral surfaces 10*t*3 adjacent thereto. In some embodiments, the lateral surfaces 10*t*2 may be connected to the long edges of the surface 10*t*1, the lateral surfaces 10*t*3 may be connected to the short edges of the surface 10*t*1. The trench 10*t* may have a width W21 defined by a distance between the two opposite lateral surfaces 10*t*2. The trench 10*t* may have a height (or depth) H21 defined by a distance between the surface 10*t*1 of the trench 10*t* and the surface 101 of the carrier 10. The trench 10*t* may have a length L21 defined by a distance between the two opposite lateral surfaces 10*t*3. The length L21 may be greater than the width W21. In some embodiments, the trench 10*t* may have a tapered cross-section. In some embodiments, the cross-section of the trench 10*t* may taper from top to bottom (i.e., the surface 10*t*1 of the trench 10*t***).

In some embodiments, the directing structure 40 may be disposed between the region 201 and the region 202 of the gap 20. In some embodiments, the directing structure 40 may be disposed in the trench 10*t*. The gap 20 may be defined by the surface 112 of the substrate 11 and the upper surface of the carrier 10. The directing structure 40 may be configured to reduce a migration of the filling material from the region 201 of the gap 20 to the region 202 of the gap 20. The directing structure 40 may include at least one protrusion (refer to the symbol 40 for brevity) protruding from the bottom surface 10*t*1 of the trench 10*t*. The protrusion 40 may extend from the carrier 10 toward the substrate 11. The protrusion 40 may have an end 401 distal from the surface 10*t*1 of the trench 10*t* (or adjacent to the surface 112 of the substrate 11). The end 401 of the protrusion 40 may be at an elevation lower than the surface 101 of the carrier 10. The protrusion 40 may have a tapered cross-section. In some embodiments, the protrusion 40 may taper from bottom to top (i.e., from the end contacting the surface 10*t*1 of the trench 10*t* to the end 401). In some embodiments, the cross-section of the protrusion 40 may taper toward the substrate 11. The inner lateral surface 10*t*2 of the trench 10*t* may extend non-parallel to a lateral surface 403 of the protrusion 40. The protrusion 40 may have a curved surface or a rounded surface. In some embodiments, the protrusion 40 may extends horizontally in a direction substantially parallel to the lateral surface of the trench from a top view. For example, as shown in FIG. 1B, the directing structure 40 may extend horizontally in a direction substantially parallel to the lateral surface 10*t*2 (i.e., the y-direction). The directing structure 40 may extend from one lateral surface 10*t*3 to the other lateral surface 10*t*3 of the trench 10*t*. The directing structure 40 may have a rectangular shape from a top view.

In some embodiments as illustrated in FIG. 1B, the directing structure 40 may have a continuous structure (or, monolithic structure) while in some other embodiments, for example, those illustrated in FIG. 3B and discussed below, the directing structure 40 may be composed of non-continuous structures (or discrete structures).

Figure 2A:
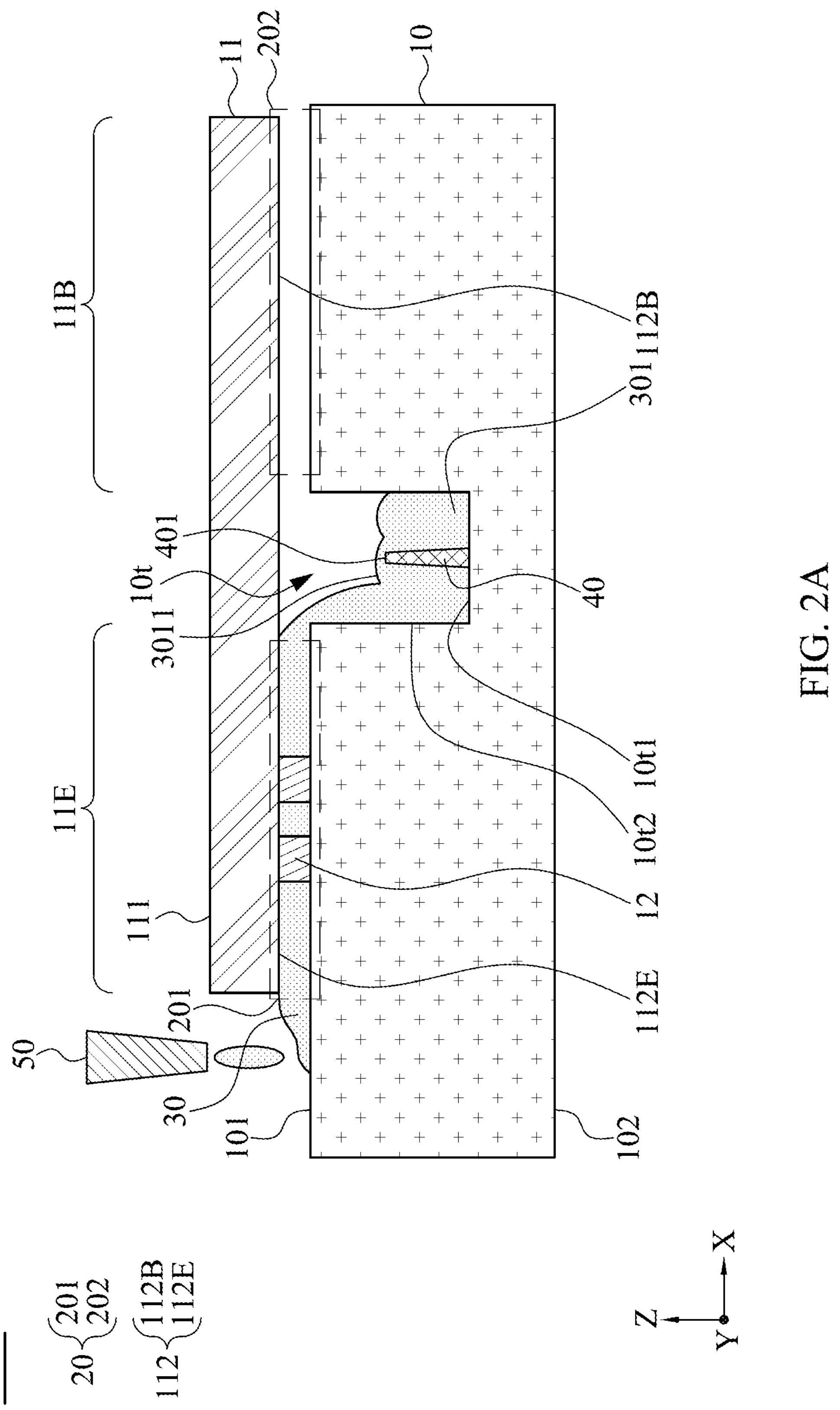
FIG. 2A is a cross-sectional view of an exemplary package structure according to some embodiments of the present disclosure.
Figure 2B:
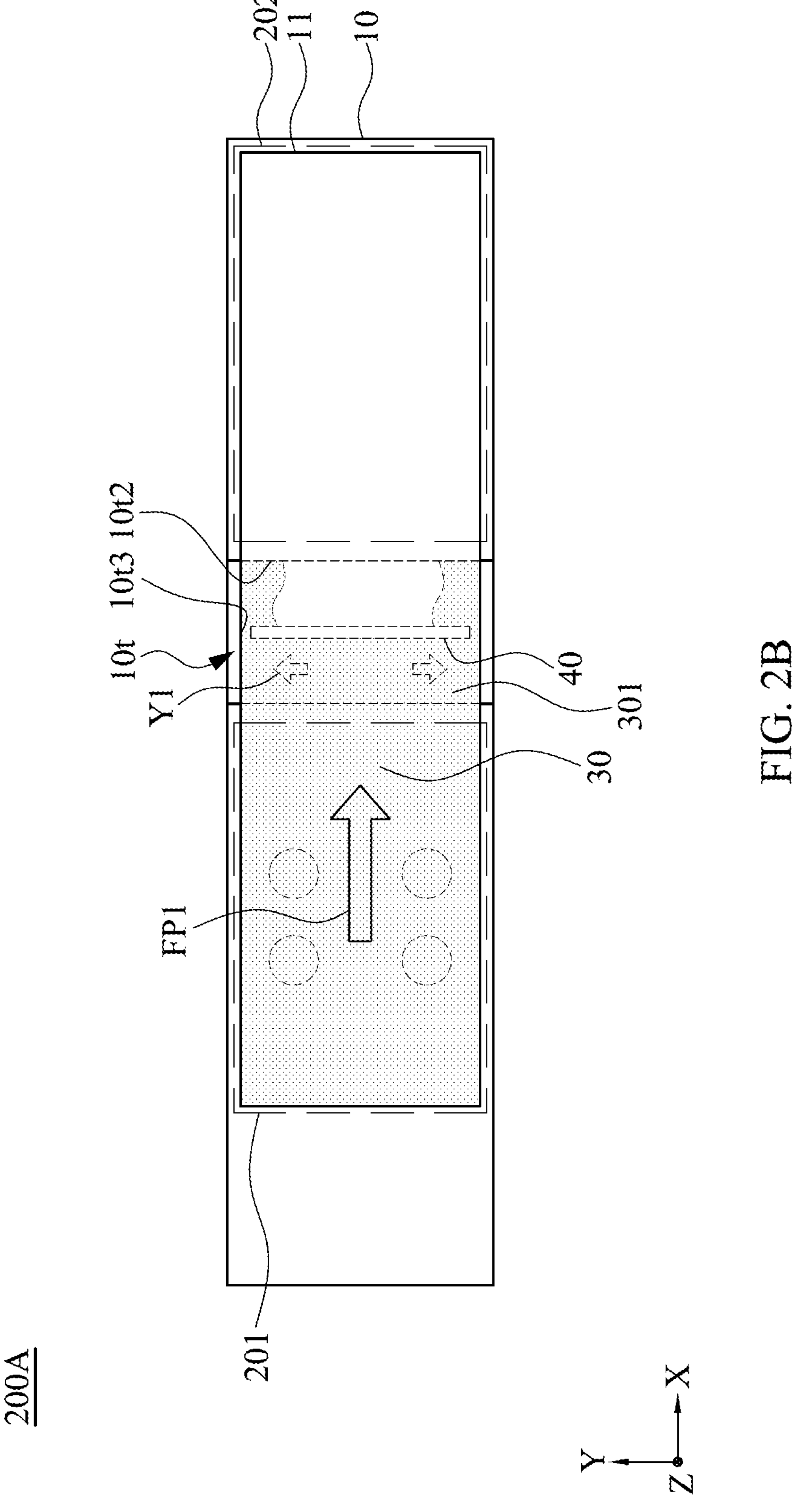
FIG. 2B is a top view of an exemplary package structure according to some embodiments of the present disclosure.

FIG. 2A is a cross-sectional view of the package structure 200A during (or after) a process for disposing the filling material according to some embodiments of the present disclosure. FIG. 2B is a top view of an exemplary package structure (e.g., the package structure 200A) during a process for disposing the filling material according to some embodiments of the present disclosure.

During the process for disposing the filling material, a filling material 30 may be dispensed by syringe equipment 50 next to the substrate 11. In some embodiments, the filling material 30 may be an underfill or other suitable resin material. In some embodiments, the filling material 30 can include a molding compound, polymer, a liquid epoxy, or the like. In some embodiments, the filling material 30 may include fillers. In some embodiments, the filling material 30 may include no filler. In some embodiments, the filling material 30 may be a low-viscosity suspension of silica in prepolymer. In some embodiments, the filling material 30 may flow into the gap 20 (e.g., the region 201 of the gap 20) by capillary action between the portion 11E of the substrate 11 and the carrier 10. The filling material 30 may flow through and surround the connecting elements 12. The connection elements 12 may be encapsulated by the filling material 30. In some embodiments, the filling material 30 may overflow beyond the region 201 of the gap 20. In some embodiments, in order to completely cover the connecting elements 12 for the reinforcement of the joint between the connecting elements 12 and the circuit layer of the carrier 10 and/or between the connecting elements 12 and the circuit layer of the substrate 11, the filling material 30 may be dispensed in an amount that may overflow beyond the region 201 of the gap 20. The region 201 of the gap 20 may be filled with the filling material 30. Once excess filling material 30 flows through the region 201 of the gap 20, the surface tension may be insufficient to contain the excess filling material 30 and thus overflow may enter the trench 10*t* to form a portion 301 in the trench 10*t*. In some embodiments, the filling material 30 may be disposed between the substrate 11 and the upper surface 10*t*1 of the carrier 10.

The trench 10*t* may be configured to reduce a migration of the filling material from region 201 to region 202. In some embodiments, the trench 10*t* may be configured to prevent overflow of the filling material 30 from migrating from region 201 to region 202, and may have a capacity defined by the length L21, the width W21, and the height H21. The capacity of the trench 10*t* is intended to contain the overflow of the filling material. For example, the capacity of the trench 10*t* may be around 0.8 $mm^3$. Owing to unpredictability of the flow of filling material 30 in different parts of the region 201 of the gap 20, the portion 301 of filling material 30 entering the trench 10*t* may occupy only a part of the trench 10*t*. In some embodiments, the filling material in the trench may have a curved surface (or a rounded surface) 3011.

The directing structure 40 may be disposed in a flow path FP1 of the filling material 30. The flow path refers to the path (especially, the main path) where the filling material travel through during the process of disposing the filling material. The protrusion of the directing structure 40 may extend in a direction non-parallel to the flow path FP1 of the filling material 30 from a top view, as illustrated in FIG. 2B (e.g. the FP1 is along the x-direction and the protrusion of the directing structure 40 extends along the y-direction). When the overflow of the filling material 30 (e.g., the portion 301) enters the trench 10*t*, the directing structure 40 can guide the overflow quickly so that the portion 301 of the filling material 30 flows along the directing structure 40 toward the lateral surfaces 10*t*3 of the trench 10*t* (i.e., along the direction of arrows Y1). The directing structure 40 may be configured to reduce a migration of the filling material 30 from the region 201 to the region 202. As a result, the capillary action can be reduced or destroyed. The portion 301 of the filling material 30 may contact the directing structure 40. In some embodiments, the directing structure 40 may be configured to direct the overflow of the filling material 30 substantially parallel to the long edge of the trench 10*t* (e.g., the lateral surface 10*t*2). As such, the overflow of the underfill 30 is kept from the region 202 of the gap 20 by collecting in a small area of the trench 10*t*, as illustrated in FIG. 2A. Thus, the directing structure 40 can prevent the filling material 30 from being propelled by the capillary action to the region 202, and therefore, no filling material enters the region 202. The space (i.e., the region 202) beneath the portion 11B of the substrate is free from a filling material. In other words, the region 202 is not contaminated by filling material. The filling material 30 may be in contact with the portion 11E of the substrate 11 and free from being in contact with the portion 11B of the substrate 11.

In some embodiments, the substrate 11 of the package structure 200A may be bendable, flexible, or pliable and the portion 11B above the region 202 of the gap 20 may be responsible for the most of the deformation when the substrate 11 is bent. Owing to the directing structure 40, the overflow of the filling material 30 may be confined within the trench 10*t* and no excess of the filling material 30 would be propelled by the capillary action to the region 202 of the gap 20. The pliability or flexibility of the package structure 200A is unaffected by the overflow of the filling material 30.

In some embodiments, the package structure 200A may include an adhesion enhancement structure disposed on the surface 10t1 of the carrier 10. In some embodiments, the adhesion enhancement structure includes the directing structure 40 disposed in the trench 10t. In some embodiments, the directing structure 40 per se may be referred to as adhesion enhancement structure or the directing structure 40 together with the trench 10t may be referred to as adhesion enhancement structure. The adhesion enhancement structure may be configured to enhance adhesion strength between the filling material 30 and the surface 10t1 and/or the surface 101 of the carrier 10. The adhesion enhancement structure may include at least one protrusion (e.g., the protrusion), which is referred to the symbol 40 for brevity. The protrusion 40 may have a surface 401. The surface 401 may have a curved or rounded topography. The surface 401 may be at a lower elevation than the surface 101 of the carrier 10. The protrusion 40 may be surrounded by the filling material 30 (or the portion 301 of the filling material 30). The protrusion 40 may be in contact with the filling material 30 (or the portion 301 of the filling material 30). The adhesion enhancement structure (in particular, the protrusion 40) increases the contact area between the filling material 30 and the material of the surface of the carrier 10. As a result, the filling material 30 can be well retained in the trench 10t without being dragged into the region 202 of the gap 20 by capillary action between the portion 11B of the substrate 11 and the carrier 10. Furthermore, the adhesion enhancement structure may enhance the mold-locked effect of the filling material 30. Owing to the reinforcement of the joint between the filling material 30 and the carrier 10 by the adhesion enhancement structure, delamination between the filling material 30 and the surface (e.g., the surface 10t1) of the carrier 10 may be reduced or avoided. The adhesion enhancement structure may be configured to reduce an extent of delamination between the filling material 30 and the upper surface 10t1 of the carrier 10. In addition, since the overflow of the filling material 30 can be well retained in the trench 10t without being dragged into the region 202 of the gap 20 by capillary action, the directing structure 40 allows for a more buffer for the addition amount of the filling material; in other words, the filling material 30 may be dispensed even in a higher excessive amount without overflowing into the region 202 of the gap 20.

Figure 2C:
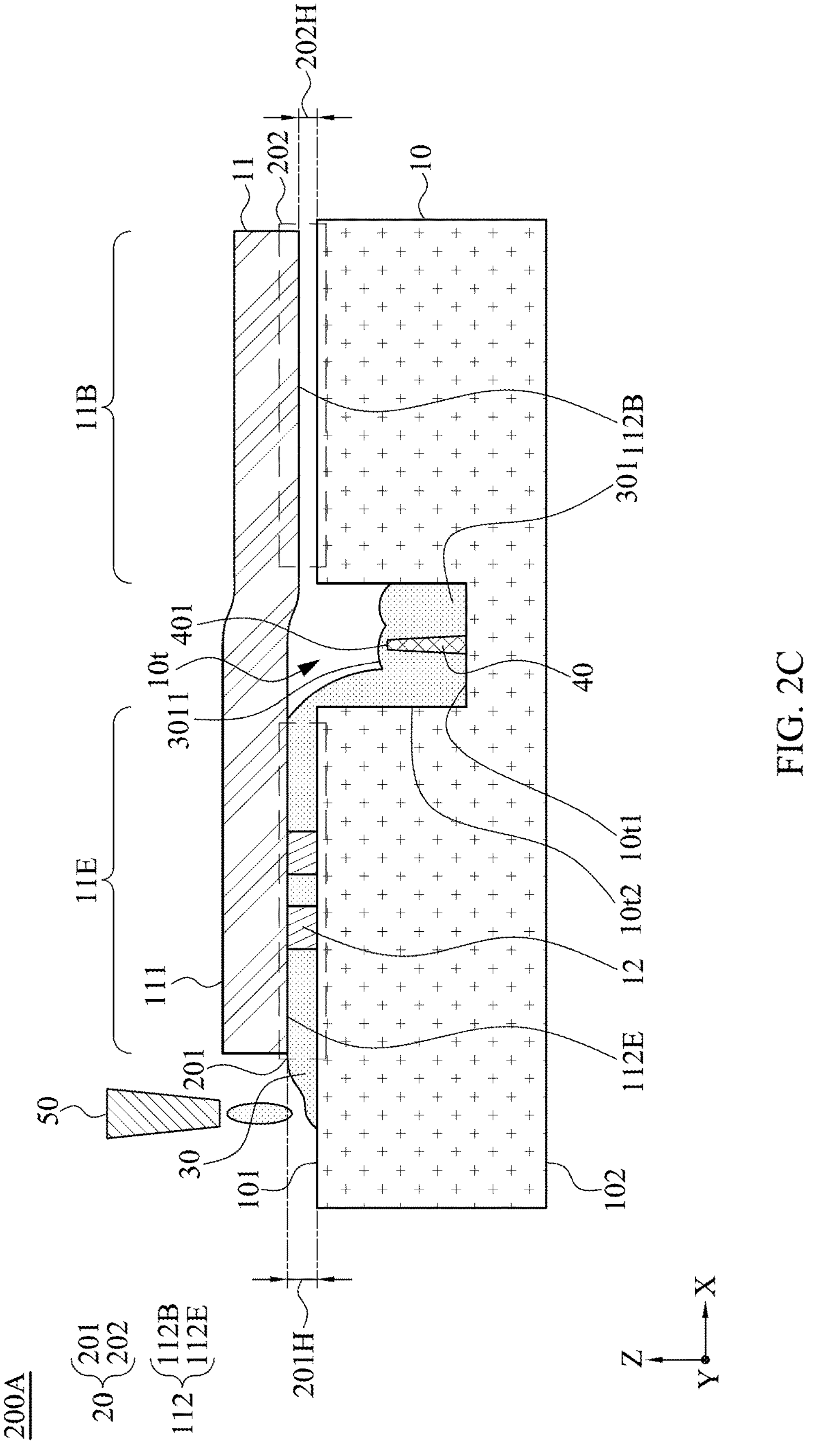
FIG. 2C is a cross-sectional view of an exemplary package structure according to some embodiments of the present disclosure.

FIG. 2C is a cross-sectional view of an exemplary package structure (e.g., the package structure 200A) according to some embodiments of the present disclosure. As shown in FIG. 2C, the portion 11B of the package structure 200A may droop to an elevation lower than that of the portion 11E in relative to the surface 101 of the carrier 10 because no connection element supporting the portion 11B is present in the region 202 of the gap 20. The region 201 of the gap 20 may have a height 201H greater than a height 202H of the region 202 of the gap 20. The shorter height 202H of the region 202 of the gap 20 may enhance the capillary action between the portion 11B of the substrate 11 and the carrier 10, which may attract higher amount of overflow of the filling material 30. In the present disclosure, due to the presence of the directing structure 40 in the trench 10t, the filling material 30 may be prevented from being propelled by the capillary action to the region 202.

Figure 3A:
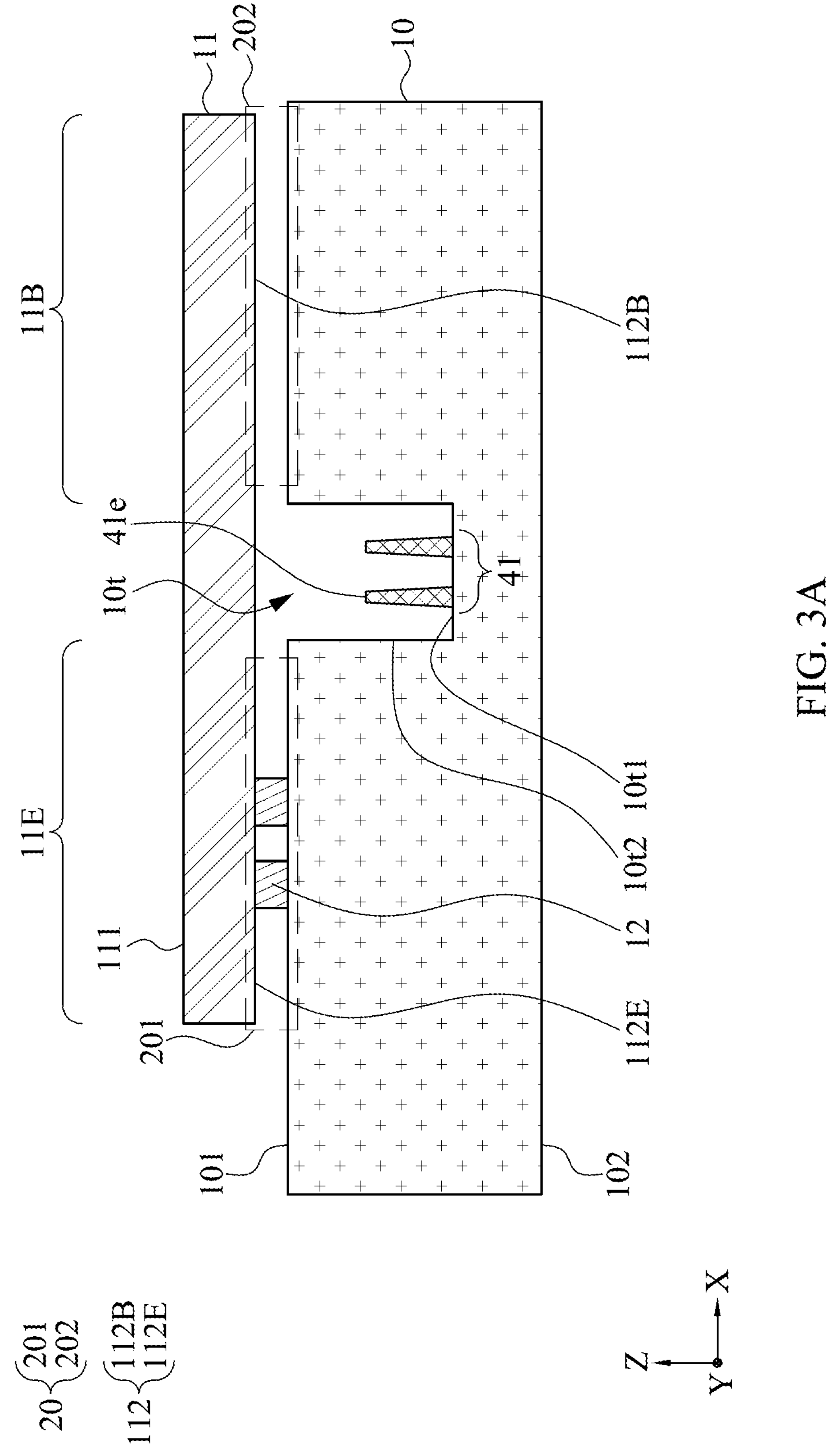
FIG. 3A is a cross-sectional view of an exemplary package structure according to some embodiments of the present disclosure.
Figure 3B:
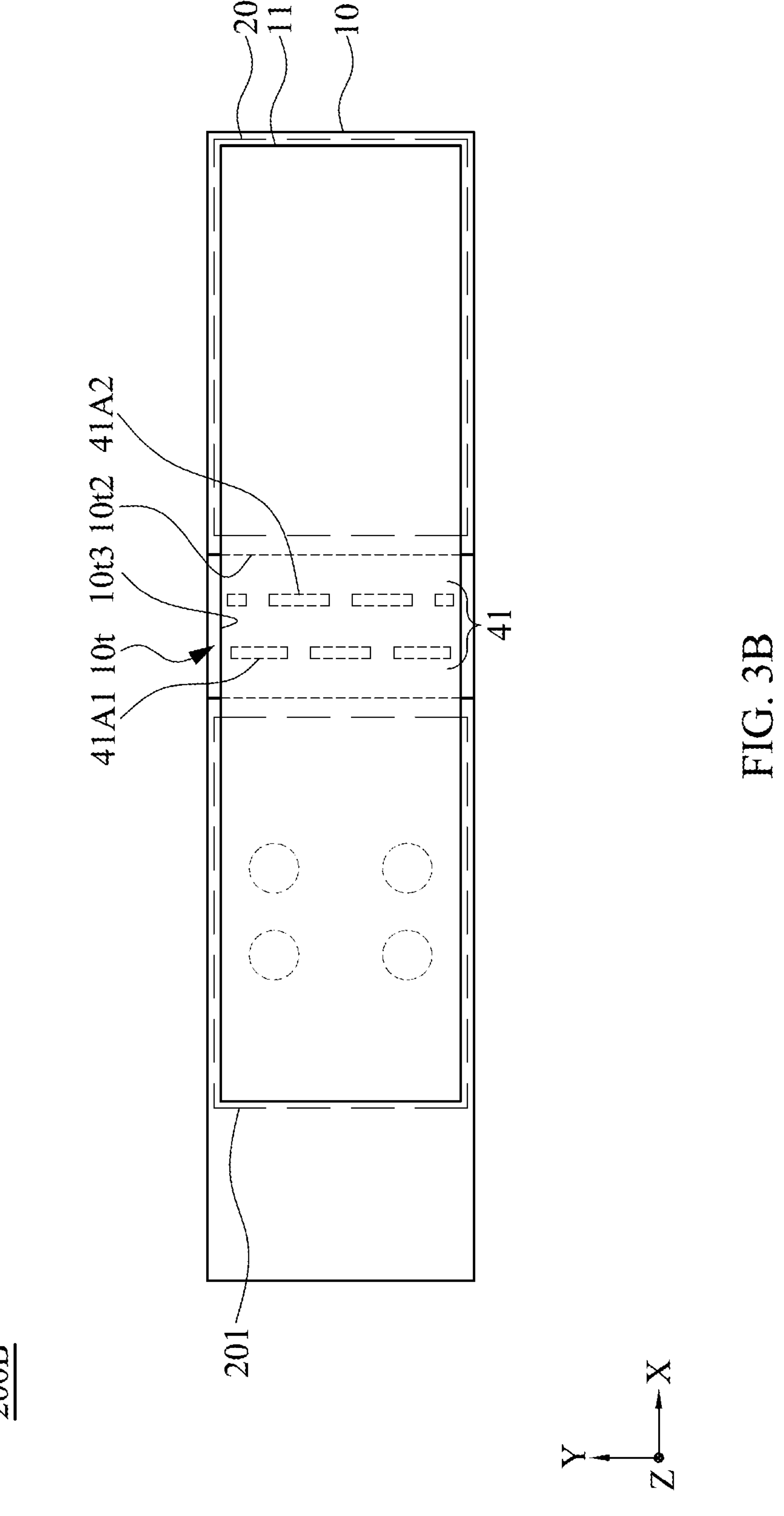
FIG. 3B is a top view of an exemplary package structure according to some embodiments of the present disclosure.

FIG. 3A is a cross-sectional view of an exemplary package structure 200B according to some embodiments of the present disclosure. FIG. 3B is a top view of the package structure 200B according to some embodiments of the present disclosure. The package structure 200B of FIGS. 3A and 3B is similar to the package structure 200A of FIGS. 1A and 1B. Some details may correspond to previous descriptions and are thus not repeated for brevity, with differences therebetween as follows.

The package structure 200B may include a directing structure (or a microstructure) 41 in the trench 10t. The directing structure 41 may be configured to reduce a migration of the filling material from the region 201 of the gap 20 to the region 202 of the gap 20. The directing structure 41 may be composed of non-continuous structures (or discrete structures). The directing structure 41 may include a plurality of protrusions (refer to the symbol 41 for brevity) protruding from the bottom surface 10t1 of the trench 10t.

The protrusions 41 may have an end 41e distal from the surface 10t1 of the trench 10t (or adjacent to the surface 112 of the substrate 11). The end 41e of each of the protrusions 41 may be at an elevation lower than the surface 101 of the carrier 10. The protrusions 41 may have a tapered cross-section, e.g., the protrusions 41 may taper from bottom to top. In some embodiments, the protrusions 41 or (the cross-section of the protrusions 41) may taper toward the substrate 11. The protrusions 41 may have a curved surface or a rounded surface from a top view. In some embodiments, the protrusions 41 may extend horizontally in a direction substantially parallel to the lateral surface of the trench from a top view. In some embodiments as shown in FIG. 3B, the protrusions 41 may extend horizontally in a direction substantially parallel to the lateral surface 10t2 (i.e., in the y-direction shown in FIG. 3A). The protrusions 41 may extend from one lateral surface 10t3 to the other lateral surface 10t3 of the trench 10t. The protrusions 41 may have a rectangular shape from a top view. The plurality of protrusions 41 may be arranged in an array configuration. In some embodiments, the plurality of protrusions 41 may be staggered from a top view. In some embodiments, the protrusions 41 may include 2, 3, 4, or more protrusions. In some embodiments, the protrusions 41 may include 2, 3, 4 or more columns of protrusions. In the embodiments as illustrated in FIG. 3B, the protrusions 41 include a first group 41A1 of the protrusions arranged in a first column and a second group 41A2 of the protrusions arranged in a second column. Each protrusion in the first group 41A1 may be misaligned with each protrusion in the second group 41A2 so that the protrusions are in a staggered arrangement.

In some embodiments, the directing structure 41 per se may be referred to as adhesion enhancement structure or the directing structure 41 together with the trench 10t may be referred to as adhesion enhancement structure. The adhesion enhancement structure 41 may be disposed on or above the surface 10t1 of the carrier 10. The adhesion enhancement structure 41 may be configured to enhance an adhesion strength between the filling material 30 and the surface 10t1 and/or the surface 101 of the carrier 10. The adhesion enhancement structure 41 may include one or more protrusions (e.g., the protrusions), which is referred to the symbol 41 for brevity. In some embodiments, the adhesion enhancement structure 41 may include at least two protrusions, at least three protrusions, at least four protrusions, or more.

Figure 3C:
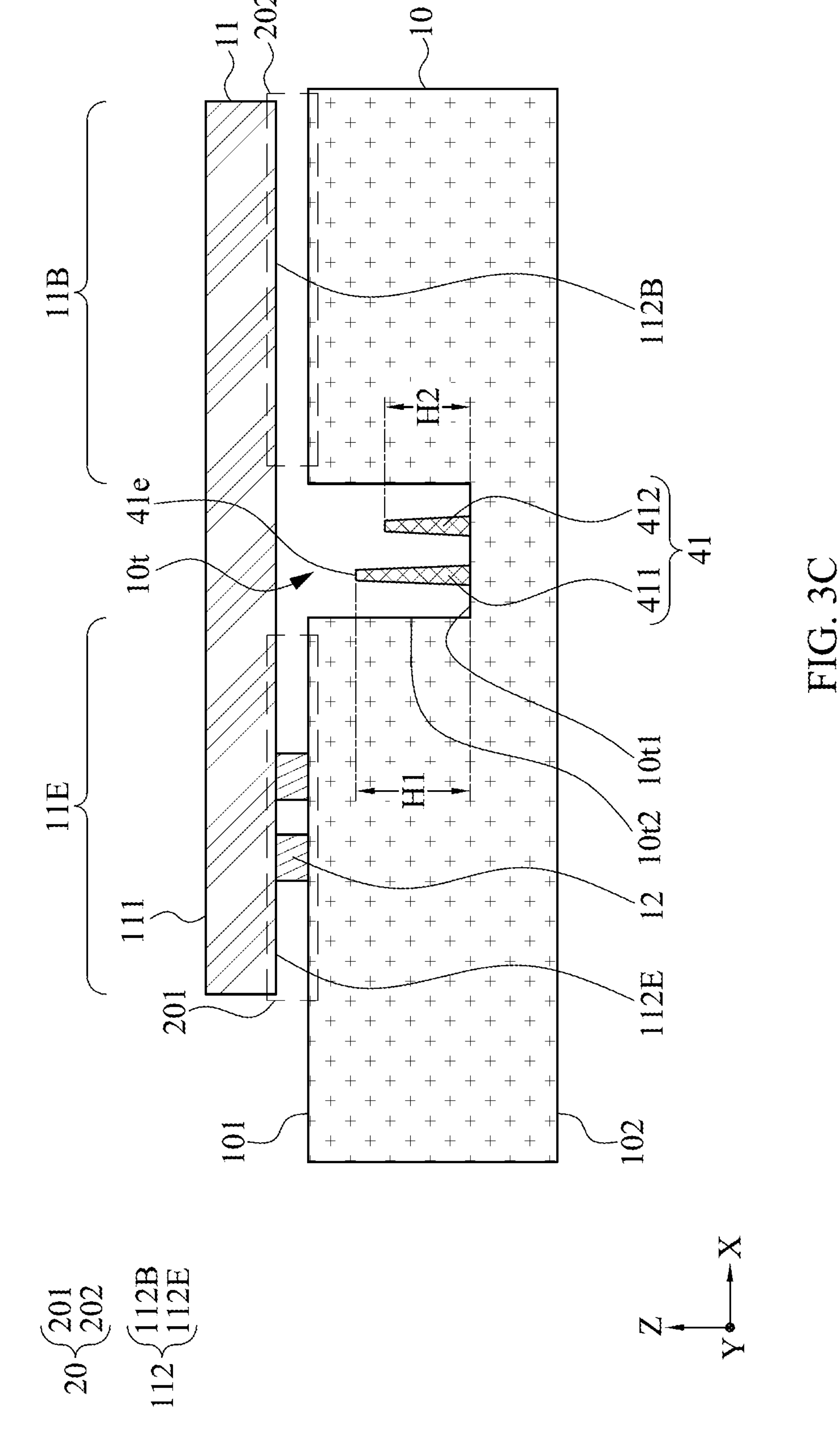
FIG. 3C is a cross-sectional view of an exemplary package structure according to some embodiments of the present disclosure.

FIG. 3C is a cross-sectional view of the package structure 200B according to some embodiments of the present disclosure. As shown in FIG. 3C, the plurality of protrusions 41 may include a protrusion 411 and a protrusion 412. The protrusion 411 may have a height H1 and the protrusion 412 may have a height H2 different from the height H2. The height H1 may be greater than the height H2. In an alternative embodiment, the height of the protrusions 411 and 412 may be substantially the same.

Figure 4A:
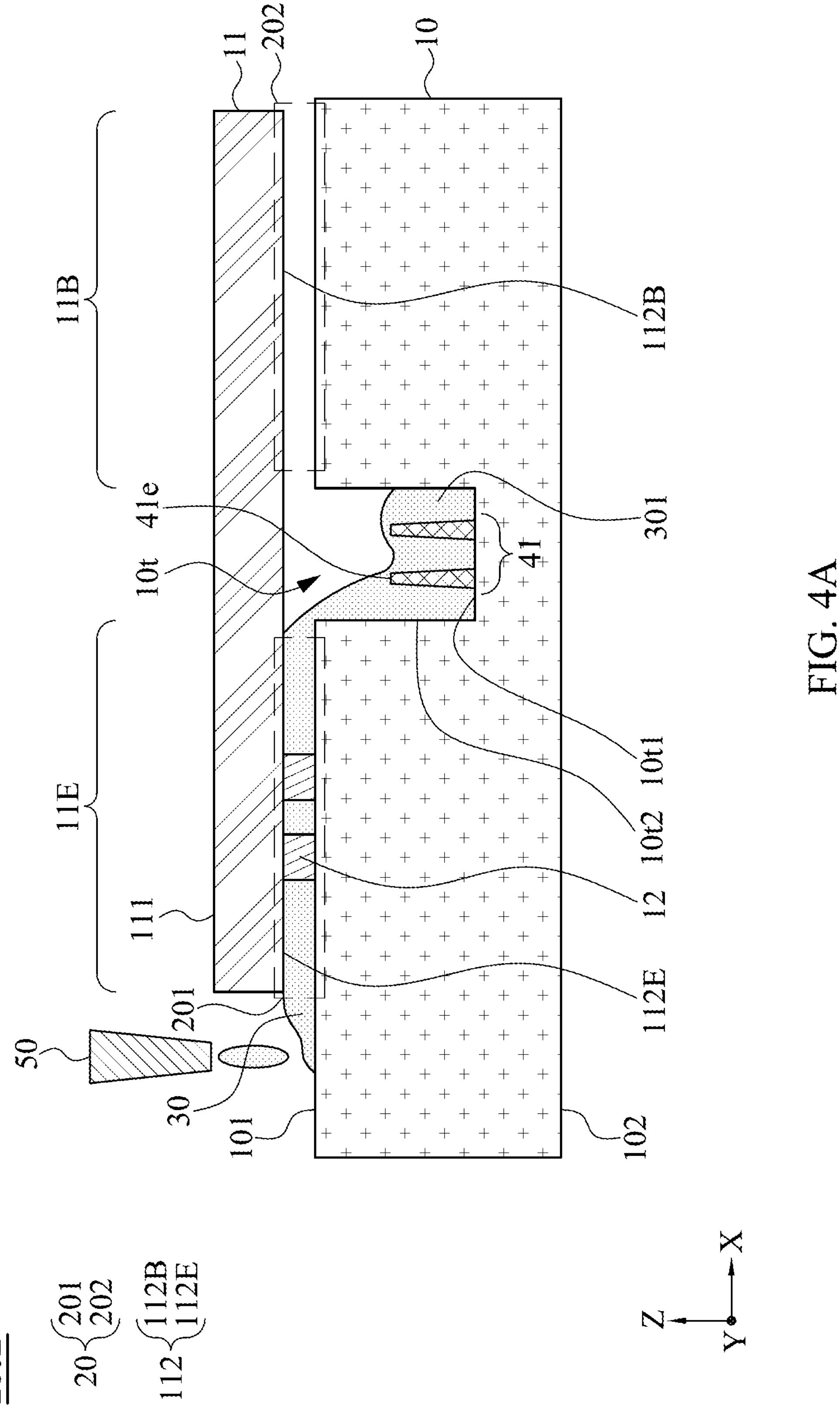
FIG. 4A is a cross-sectional view of an exemplary package structure according to some embodiments of the present disclosure.
Figure 4B:
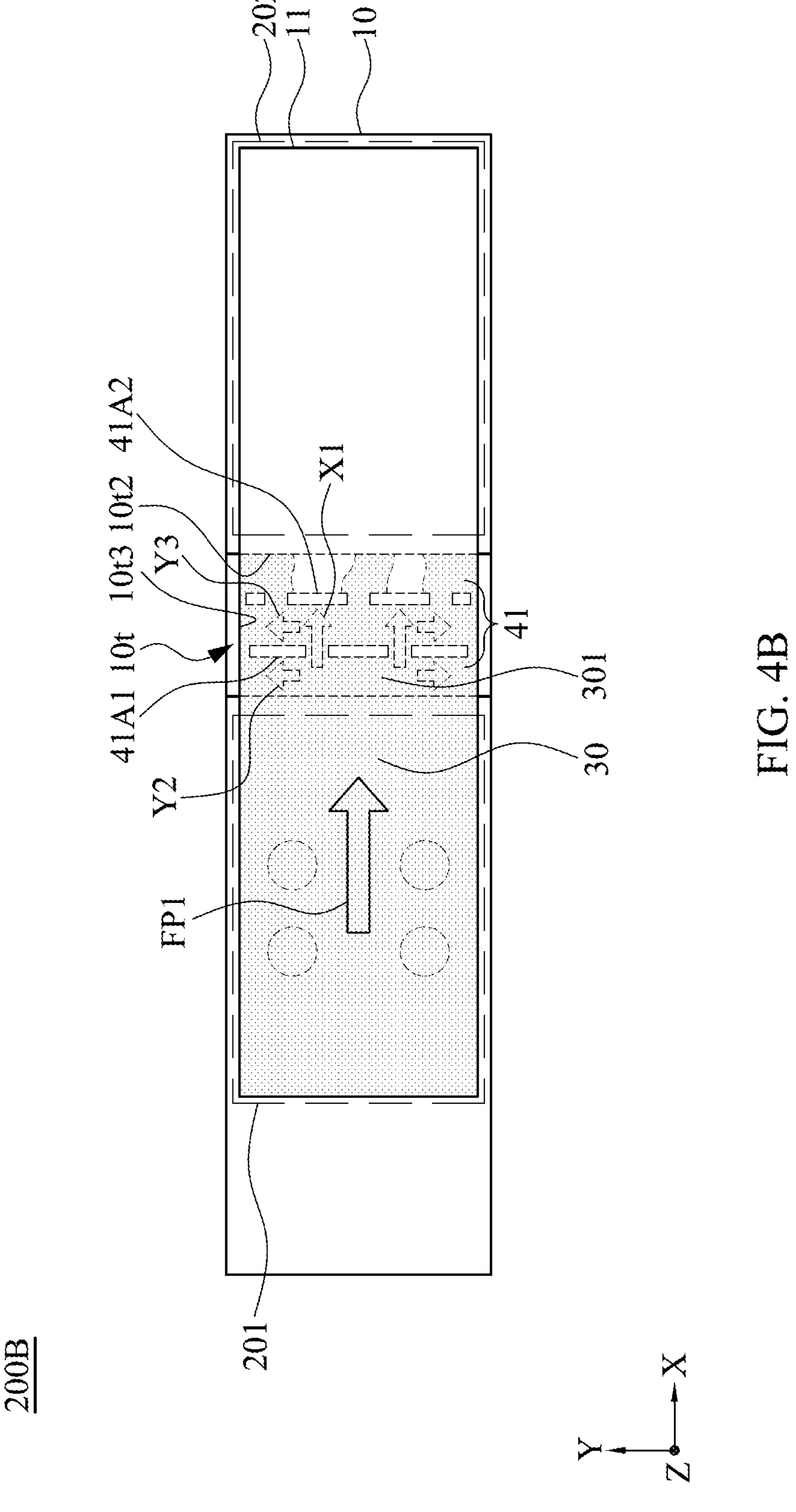
FIG. 4B is a top view of an exemplary package structure according to some embodiments of the present disclosure.

FIG. 4A is a cross-sectional view of the package structure 200B during (or after) a process for disposing a filling material according to some embodiments of the present disclosure. FIG. 4B is a top view of an exemplary package structure (e.g., the package structure 200B) during a process for disposing a filling material according to some embodiments of the present disclosure.

During the process for disposing a filling material 30, the filing material 30 may flow into the gap 20 (e.g., the region 201 of the gap 20) by capillary action between the portion 11E of the substrate 11 and the carrier 10. The details of the filling material 30 in the region 201 are similar to those discussed above with respect to FIGS. 2A and 2B. Once excess filling material 30 flows through the region 201 of the gap 20, the surface tension may be insufficient to contain the excess filling material 30 and thus an overflow of the filling material 30 may enter the trench 10*t* to form a portion 301 therein.

The directing structure 41 may be disposed in the flow path FP1 of the filling material 30. The protrusions of the directing structure 41 may extending in a direction non-parallel to the flow path FP1 of the filling material 30 from a top view, as illustrated in FIG. 4B (e.g., the FP1 is along the x-direction and the protrusion of the directing structure 40 extends along the y-direction). When the overflow of the filling material 30 (e.g., the portion 301) enters the trench 10, the directing structure 41 can guide the overflow quickly so that the portion 301 of the filling material 30 may, for example, flow along the protrusions 41A1 toward the lateral surfaces 10*t*3 of the trench 10*t* (i.e., along the direction of arrows Y2), flow through the gap between the protrusions 41A1 (i.e., along the direction of arrows X1) and then flow along the protrusions 41A2 toward the lateral surfaces 10*t*3 of the trench 10*t* (i.e., along the direction of arrows Y3). The directing structure 41 may be configured to reduce a migration of the filling material 30 from the region 201 to the region 202. As a result, the capillary action can be reduced or destroyed. The portion 301 of the filling material 30 may contact the protrusions 41A1 and/or the protrusions 41A2.

As such, the overflow of the filling material 30 is kept from the region 202 of the gap 20 by collecting in a small area of the trench 10*t*, as illustrated in FIG. 4B. Thus, the directing structure 41 can prevent the filling material 30 from being propelled by the capillary action to the region 202, and therefore, no filling material enters the region 202. The space (i.e., the region 202) beneath the portion 11B of the substrate is free from a filling material. In other words, the region 202 is not contaminated by a filling material. In addition, since the overflow of the filling material 30 can be well retained in the trench 10*t* without being dragged into the region 202 of the gap 20 by capillary action, the directing structure 41 allows for a more buffer for the addition amount of the filling material; in other words, the filling material 30 may be dispensed even in a higher excessive amount without overflowing into the region 202 of the gap 20. For example, the buffer weight of the filling material to be used in the process for disposing the filling material may be increased by, for examples, by 1.2 times, 1.5 times, 2 times, 3 times, 4 times or more. For example, the directing structure 41 may provide around 0.4 mg buffer weight under the baseline amount of 2.8 mg of the filling material to be added, while only 0.1-0.2 mg buffer weight may be available if no directing structure exists.

In some embodiments, the substrate 11 of the package structure 200B may be bendable, flexible, or pliable, and the portion 11B above the region 202 of the gap 20 may be responsible for most of the deformation when the substrate 11 is bent. Owing to the directing structure 41, the overflow of the filling material 30 may be confined within the trench 10*t* and no excess of the filling material 30 would be propelled the capillary action to the region 202 of the gap 20. The flexibility or pliability of the package structure 200B is unaffected by the overflow of the filling material 30.

The protrusions 41 (or the adhesion enhancement structure) may be surrounded by the portion 301 of the filling material 30. The protrusions 41 may contact the portion 301 of the filling material 30. The protrusions 41 increase the contact area between the filling material 30 and the material of the surface (e.g., the surface 10*t*1) of the carrier 10. The protrusions (or the adhesion enhancement structure) 41 may enhance the mold-locked effect of the filling material 30. Owing to the reinforcement of the joint between the filling material 30 and the carrier 10 by the adhesion enhancement structure, the delamination between the filling material 30 and the surface (e.g., the surface 10*t*1) of the carrier 10 may be avoided. The adhesion enhancement structure may be configured to reduce an extent of delamination between the filling material 30 and the upper surface 10*t*1 of the carrier 10.

Furthermore, the protrusions 41 may extend in different directions. The protrusions 41 may be configured to reduce warping stress in different directions.

FIGS. 5A, 5B, 5C, 5D, 5E, and 5F are top views of a portion of an exemplary package structure (e.g., the package structure 200B) according to some embodiments of the present disclosure. Specifically, FIGS. 5A, 5B, 5C, 5D, 5E, and 5F illustrate the configuration of the directing structure which includes a plurality of protrusions.

Figures 5A, 5B, 5C, 5D, 5E, 5F:
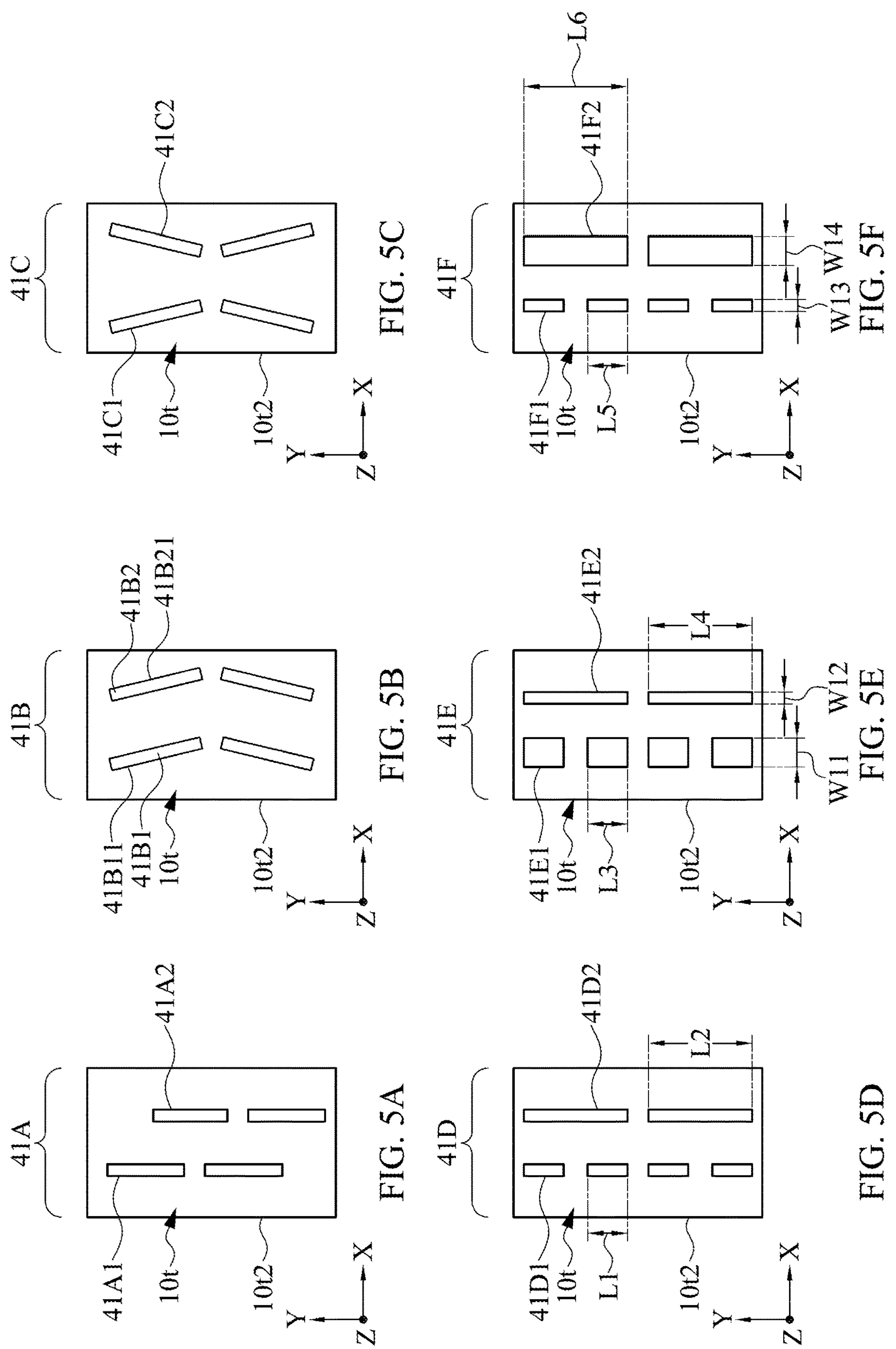
FIGS. 5A, 5B, 5C, 5D, 5E, and 5F are top views of a portion of an exemplary package structure according to some embodiments of the present disclosure.

As shown in FIG. 5A, a plurality of protrusions 41A may be disposed in the trench 10*t*. The plurality of protrusions 41A may be staggered. The plurality of protrusions 41A may include a first group 41A1 of the protrusions arranged in a first column and a second group 41A2 of the protrusions arranged in a second column. Each of the protrusions 41A1 may be misaligned with each of the protrusions 41A2 (i.e., they are staggered). The protrusions 41A1 and 41A2 may extend in a direction substantially parallel to the lateral surface 10*t*2 of the trench 10*t*.

As shown in FIG. 5B, a plurality of protrusions 41B may be disposed in the trench 10*t*. At least one of the protrusions 41B may extend in a direction non-parallel to the lateral surface 10*t*2 of the trench 10*t* from a top view. The plurality of protrusions 41B may include a first group 41B1 of the protrusions arranged in a first column and a second group 41B2 of the protrusions arranged in a second column. The protrusions 41B1 and 41B2 may extend in a direction non-parallel with the lateral surface 10*t*2 of the trench 10*t*. The lateral surface 10*t*2 of the trench 10*t* may extend non-parallel to a lateral surface 41B11 of the protrusions 41B1 or a lateral surface 41B21 of the protrusions 41B2. The adjacent protrusions 41B1 and 41B2 may extend in the same direction.

As shown in FIG. 5C, a plurality of protrusions 41C may be disposed in the trench 10*t*. The plurality of protrusions 41C may include a first group 41C1 of the protrusions arranged in a first column and a second group 41C2 of the protrusions arranged in a second column. The protrusions 41C1 and 41C2 may extend in different directions from each other from a top view. The protrusions 41C1 and 41C2 may extend in a direction non-parallel to the lateral surface 10*t*2 of the trench 10*t*. The adjacent protrusions 41C1 and 41C2 may extend in different directions.

As shown in FIG. 5D, a plurality of protrusions 41D may be disposed in the trench 10t. In some embodiments, the plurality of protrusions 41D may be staggered. The plurality of protrusions 41D may include a first group 41D1 of the protrusions arranged in a first column and a second group 41D2 of the protrusions arranged in a second column. In some embodiments, each of the protrusions 41D1 may be misaligned with each of the protrusions 41D2. The protrusions 41D1 and 41D2 may extend in a direction substantially parallel to the lateral surface 10t2 of the trench 10t. The protrusions 41D1 may have a length L1. The protrusions 41D2 may have a length L2 greater than the length L1. In some embodiments, the length L2 may be 1.1 times, 1.2 times, 1.5 times, 2 times, 3 times or more the length L1.

As shown in FIG. 5E, a plurality of protrusions 41E may be disposed in the trench 10t. In some embodiments, the plurality of protrusions 41E may be staggered. The plurality of protrusions 41E may include a first group 41E1 of the protrusions arranged in a first column and a second group 41E2 of the protrusions arranged in a second column. In some embodiments, each of the protrusions 41E1 may be misaligned with each of the protrusions 41E2. The protrusions 41E1 and 41E2 may extend in a direction substantially parallel to the lateral surface 10t2 of the trench 10t. The protrusions 41E1 may have a length L3. The protrusions 41E2 may have a length L4 greater than the length L3. In some embodiments, the length L4 may be 1.1 times, 1.2 times, 1.5 times, 2 times, 3 times or more the length L3. The protrusions 41E1 may have a width W11. The protrusions 41E2 may have a width W12 less than the width W11. In some embodiments, the width W12 may be 1.1 times, 1.2 times, 1.5 times, 2 times, 3 times or more the width W11.

As shown in FIG. 5F, a plurality of protrusions 41F may be disposed in the trench 10t. In some embodiments, the plurality of protrusions 41F may be staggered. The plurality of protrusions 41F may include a first group 41F1 of the protrusions arranged in a first column and a second group 41F2 of the protrusions arranged in a second column. In some embodiments, each of the protrusions 41F1 may be misaligned with each of the protrusions 41F2. The protrusions 41F1 and 41F2 may extend in a direction substantially parallel to the lateral surface 10t2 of the trench 10t. The protrusions 41F1 may have a length L5. The protrusions 41F2 may have a length L6 different from (e.g., greater than) the length L5. In some embodiments, the length L6 may be 1.1 times, 1.2 times, 1.5 times, 2 times, 3 times or more the length L5. The protrusions 41F1 may have a width W13. The protrusions 41F2 may have a width W14 different from (e.g., greater than) the width W13. In some embodiments, the width W14 may be 1.1 times, 1.2 times, 1.5 times, 2 times, 3 times or more the width W13.

The directing structures of FIGS. 5A, 5B, 5C, 5D, 5E, and 5F may have different patterns in a top view and configured to direct the overflow of the filling material 30 in different manners. For example, the directing structure 41B of FIG. 5B may be more efficient to direct the overflow of the filling material from a middle region of the lateral surface 10t2. Furthermore, the directing structures of FIGS. 5A, 5B, 5C, 5D, 5E, and 5F may be configured to reduce warping stress in different directions.

Figure 6A:
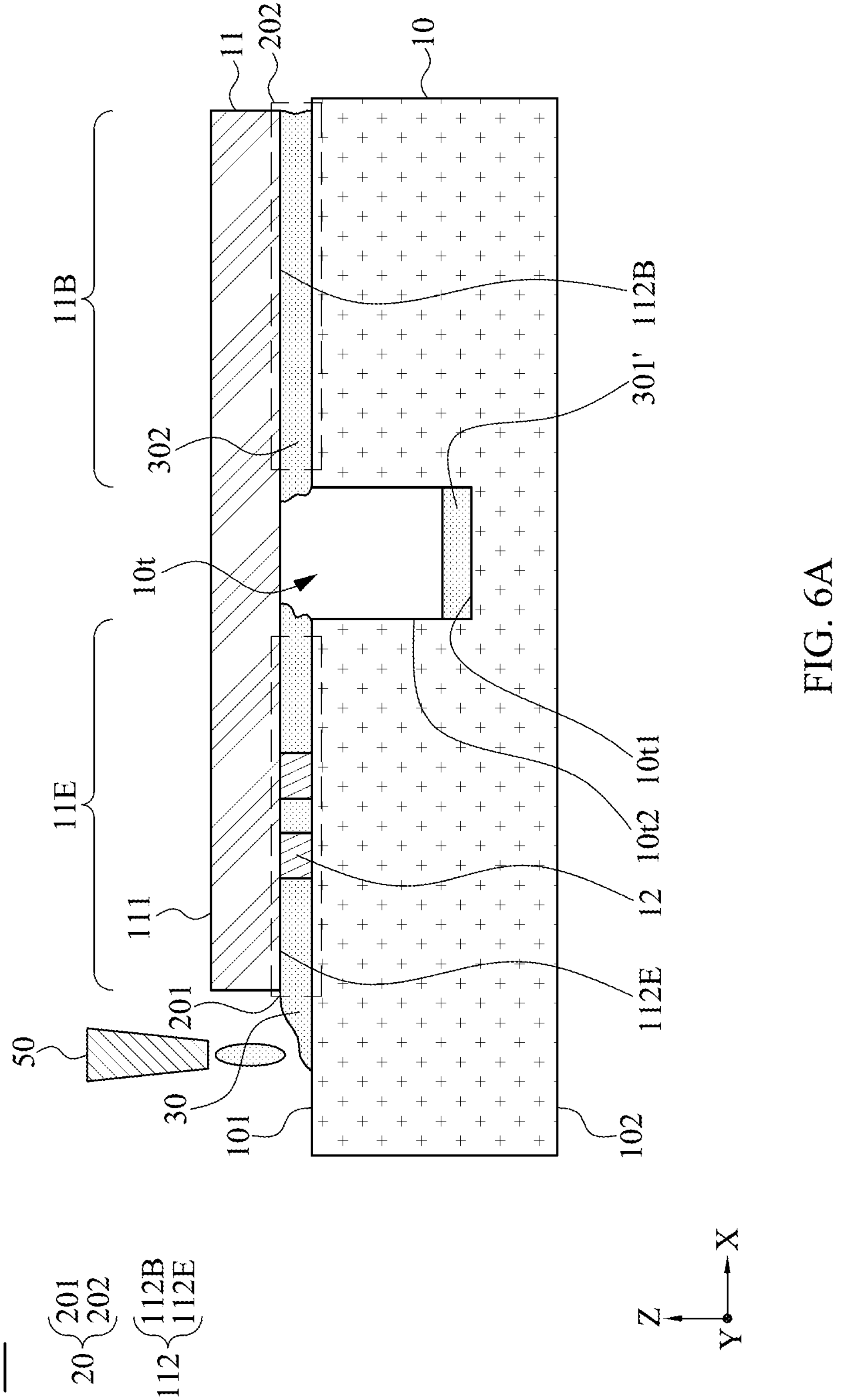
FIG. 6A is a cross-sectional view of an exemplary package structures according to some comparative embodiments of the present disclosure.
Figure 6B:
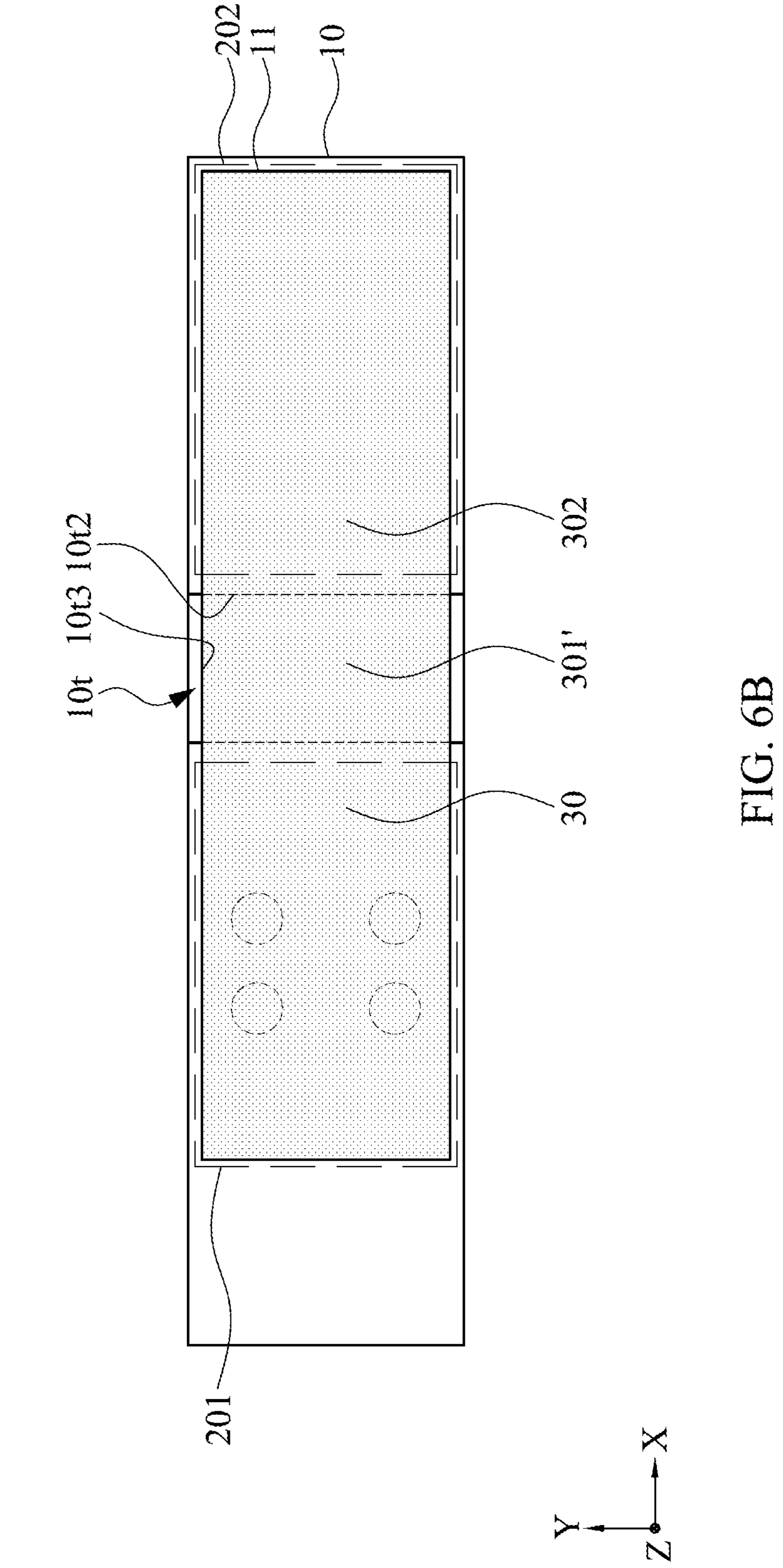
FIG. 6B is a top view of an exemplary package structure according to some comparative embodiments of the present disclosure.

FIG. 6A is a cross-sectional view of an exemplary package structure 500 during (or after) a process for disposing the filling material according to some comparative embodiments of the present disclosure. FIG. 6B is a top view of an exemplary package structure 500 during a process for disposing the filling material according to some embodiments of the present disclosure. The package structure 500 is similar to the package structure 200A of FIG. 1A except that the package structure 500 does not include any microstructure (or directing structure) in the trench 10t.

As shown in FIGS. 6A and 6B, no microstructure (or a directing structure) is disposed in the trench 10t. When the excess filling material 30 overflows into the trench 10t, the excess filling material may reach the lateral surface 10t2 of the trench 10t and then flow into the region 202 of the gap 20. Owing to the capillary action in the region 202 of the gap 20, the excess filling material 30 in the trench 10t will be dragged and flow into region 202 of the gap 20. That is, most of the excess filling material 30 is excavated and only a portion 301' with a relatively small amount remaining in the trench 10t. As shown in FIG. 6B, the region 202 of the gap 20 may be filled with the filling material 30. The filling material 30 (including that in the portion 302) may be thermally cured in place to achieve the desired encapsulant properties. After curing, the filling material 30 (including that in the portion 302) may be hardened. The portion 11B intended to be bent may not be able to do so. The portion to be bent 11B may thus lose function such that package structure 500 with flexible or pliable substrate 11 cannot be bent as originally intended.

Figure 7:
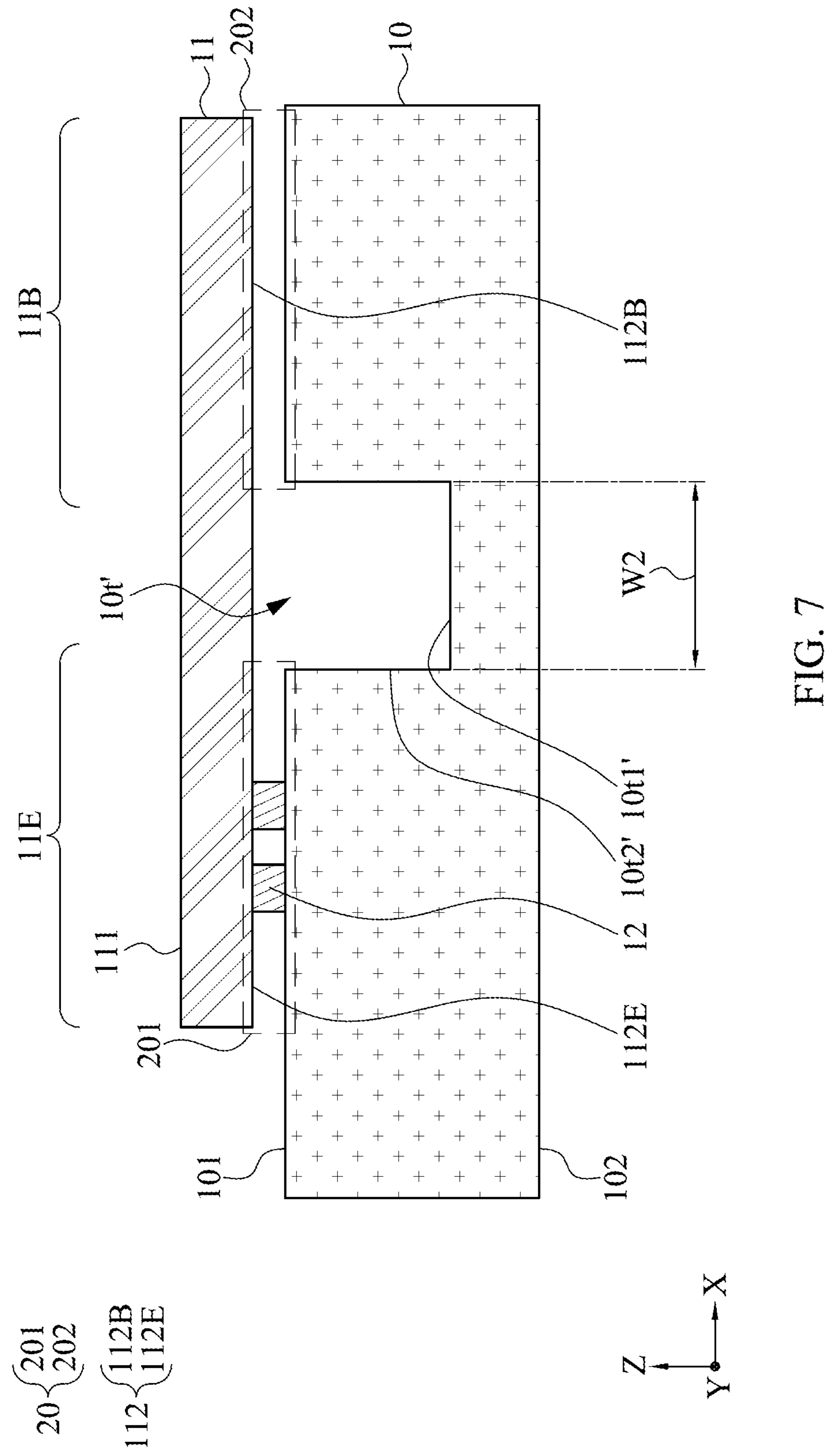
FIG. 7 is a cross-sectional view of an exemplary package structure according to some embodiments of the present disclosure.

FIG. 7 is a cross-sectional view of an exemplary package structure 200C according to some comparative embodiments of the present disclosure. The package structure 200C of FIG. 7 is similar to the package structure 200A of FIG. 1A. Some details may correspond to previous descriptions and are thus not repeated for brevity, with differences discussed as follows.

The carrier 10 of the package structure 200C may include a trench 10t' recessed from the surface 101 of the carrier 10. No microstructure or directing structure is disposed in the trench 10t'. The trench 10t' may have a width W2 greater than the width W21 of the trench 10t of the package structure 200A. The trench 10t' may have a relatively large capacity to confine the overflow of a filling material during the process for disposing the filling material. However, the relatively large size of the trench 10t' may not meet the miniaturization demands of semiconductor manufacturing.

Figure 8A:
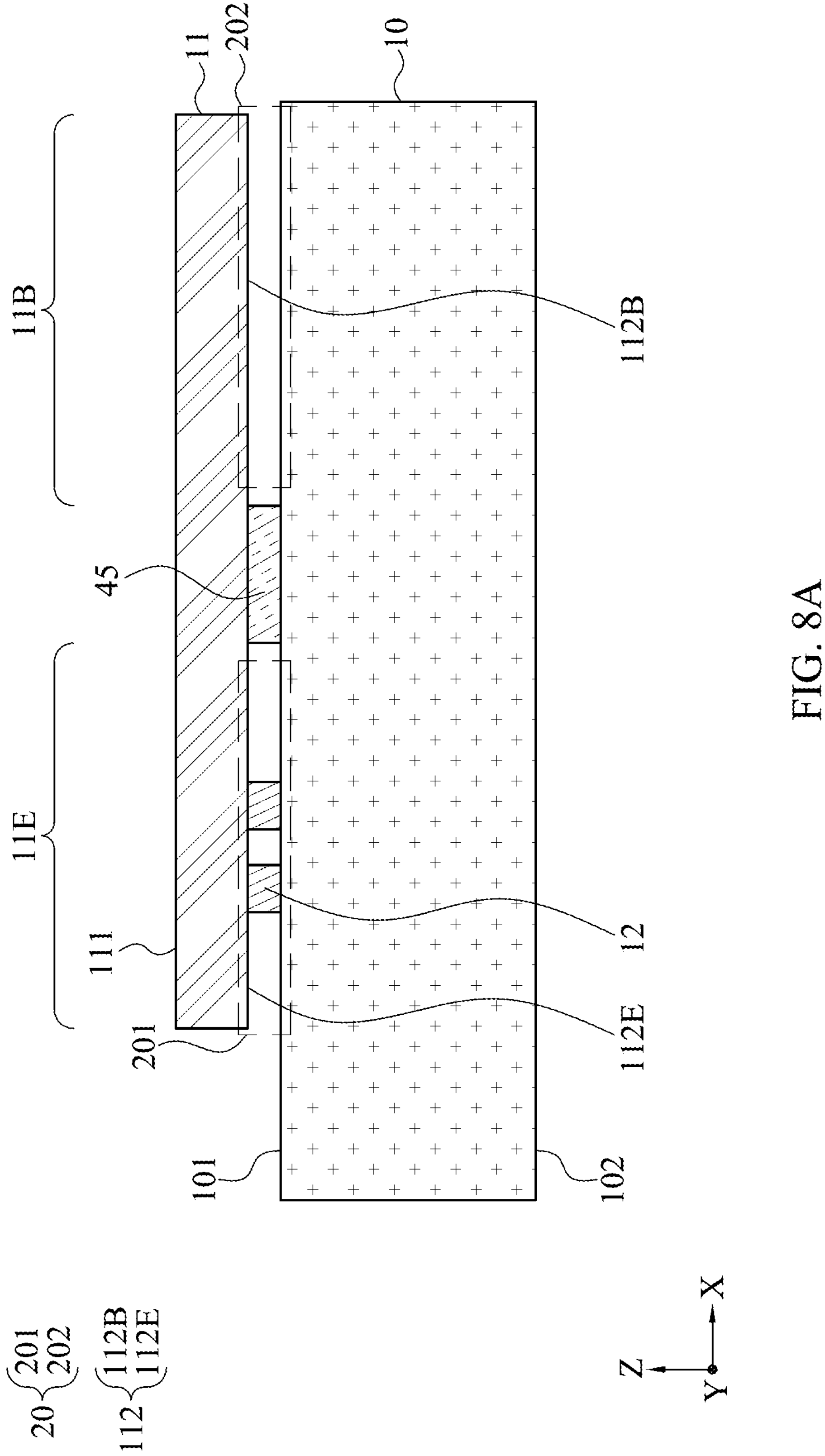
FIG. 8A is a cross-sectional view of an exemplary package structure according to some embodiments of the present disclosure.

FIG. 8A is a cross-sectional view of an exemplary package structure 200D according to some embodiments of the present disclosure. The package structure 200D of FIG. 8A is similar to the package structure 200A of FIG. 1A. Some details may correspond to previous descriptions and are thus not repeated for brevity, with differences discussed as follows.

The package structure 200D may not include any trench in the carrier 10. The package structure 200D may include a blocking structure (or microstructure) 45 disposed between the surface 112 of the substrate 11 and the surface 101 of the carrier 10. The blocking structure 45 may contact the surface 101 of the carrier and the surface 112 of the substrate 11.

Figure 8B:
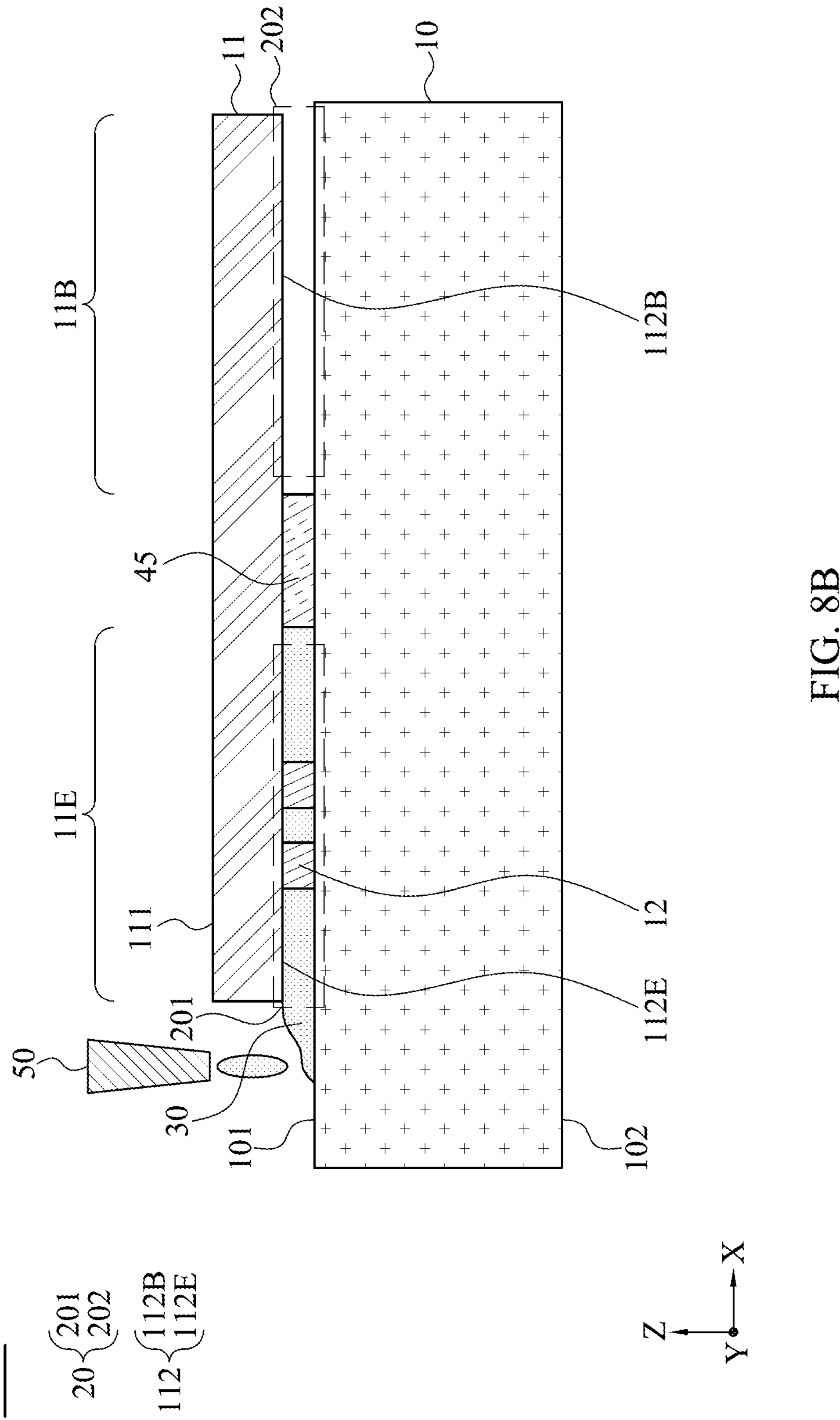
FIG. 8B is a cross-sectional view of an exemplary package structure according to some embodiments of the present disclosure.

FIG. 8B is a cross-sectional view of an exemplary package structure (e.g., the package structure 200D) during a process for disposing the filling material according to some embodiments of the present disclosure.

During the process for disposing the filling material, a filling material 30 may be dispensed by syringe equipment 50 in a location next to the substrate 11. The filling material 30 may flow into the gap 20 (or the region 201) by capillary action between the portion 11E of the substrate 11 and the carrier 10 through and around the connecting elements 12 therebetween. The blocking structure 45 may be configured to prevent the filling material 30 from overflowing from the region 201 to the region 202 so that the region 201 may be filled with the filling material 30 and the region 202 may be free from the filling material 30.

Figure 9:
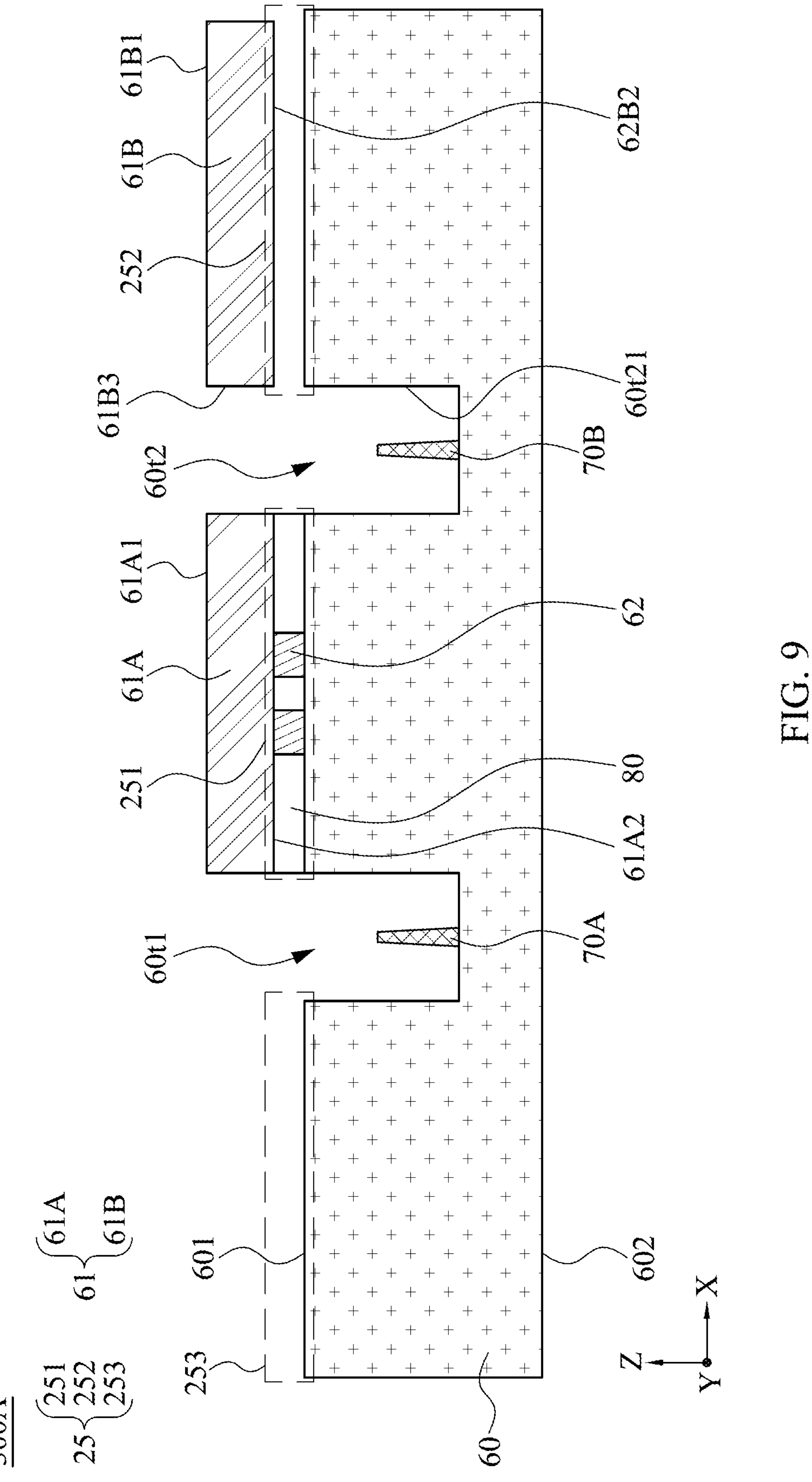
FIG. 9 is a cross-sectional view of an exemplary package structure according to some embodiments of the present disclosure.

FIG. 9 is a cross-sectional view of an exemplary package structure 300A according to some embodiments of the present disclosure. The package structure 300A may include a carrier 60, a substrate 61, a connection element 62, and filling material 80.

The substrate 61 may include one or more semiconductor chip (or a die), for example, a semiconductor chip (or a die) 61A and a semiconductor chip (or a die) 61B shown in FIG. 9. The semiconductor chip 61A may be disposed above the carrier 60 and have a surface 61A1 and a surface 61A2 opposite to the surface 61A1. The surface 61A2 may face the carrier 60. The semiconductor chip 61A may include an integrated circuit, active components, passive components, or the like.

The semiconductor chip 61B may be disposed above the carrier 60. The semiconductor chip 61B may disposed adjacent to the semiconductor chip 61A. The semiconductor chip 61B may have a surface 61B1 and a surface 61B2 opposite to the surface 61B1. The surface 61B2 may face the carrier 60. The semiconductor chip 61B may have a lateral surface 61B3 extending between the surface 61B1 and the surface 61B2. The semiconductor chip 61B may include an integrated circuit, active components, passive components, or the like.

The carrier 60 may be similar to the carrier 10 of the package structure 200A of FIG. 1A. The carrier 60 may be disposed below the semiconductor chip 61A or 61B. The carrier 60 may has a surface 601 and the surface 602 opposite to the surface 601. The surface 601 of the carrier 60 may face the semiconductor chip 61A or 61B. The carrier 60 may include a circuit layer or a conductive pad (not shown) connected to the connection element 62. The carrier 60 may be electrically connected to the semiconductor chip 61A via the connection element 62. Some details of the connection element 62 and the filling material 80 (discussed below) may correspond to previous descriptions with respect to the connection element 12 and the filling material 30 and are thus not repeated for brevity.

The carrier 60 may include one or more trenches recessed from the surface 601 of the carrier 60. In the embodiments illustrated in FIG. 9, the carrier 60 may include a trench **60*t*1 and a trench 60*t*2 recessed from the surface 601 of the carrier 60, respectively. The trench 60*t*2 may be disposed between the semiconductor chip 61A and the semiconductor chip 61B. The trench 60*t*1 may be disposed adjacent to (or around) the semiconductor chip 61A but not adjacent to the semiconductor chip 61B. The surface 601 of the carrier 60 include a region 251 a region 252 and a region 253 located on the non-recessed are. The regions 251, 252 and 253 constitutes a region 25 which is configured to accommodate electronic device or circuitry. As illustrated in FIG. 9, the semiconductor chip 61A is disposed in the region 251 and the semiconductor chip 61B is disposed in the region 252. The trench 60*t*1 may be between the region 251 and the region 253. The trench 60*t*2 may be between the region 251 and the region 252. The trench 60*t*2 may have a lateral surface 60*t*21. The lateral surface 60*t*21 of the trench 60*t*2 may be substantially aligned with the lateral surface 61B3 of the semiconductor chip 61**B.

Similar to FIG. 1A, the carrier 60 and the substrate 61 define a gap therebetween, including a region 251 (refer to the symbol 251 for brevity) between the semiconductor chip 61A and the carrier 60 and a region 252 (refer to the symbol 252 for brevity) between the semiconductor chip 61B and the carrier 60. The size (or the height) of the region 252 may be sufficiently small to induce the capillary action.

The package structure 300A may include a directing structure 70A in the trench **60*t*1. During the process of disposing the filling material 80, the directing structure 70A may be configured to reduce a migration of the filling material 80 from the region 251 to the region 253. The directing structure 70A may include at least one protrusion. The directing structure 70A may be referred to as an adhesion enhancement structure. The adhesion enhancement structure 70A may be configured to enhance an adhesion strength between a filling material (not shown) and material of a bottom surface of trench 60*t*1 of the carrier 60**.

The package structure 300A may include a directing structure 70B in the trench **60*t*2. During the f process of disposing the filling material 80, the directing structure 70B may be configured to reduce a migration of the filling material 80 from the region 251 to the region 252. The directing structure 70B may include at least one protrusion. The directing structure 70B may be referred to as adhesion enhancement structure. The adhesion enhancement structure 70B may be configured to enhance adhesion strength between a filling material (not shown) and material of a bottom surface of trench 60*t*2 of the carrier 60**.

Figure 10:
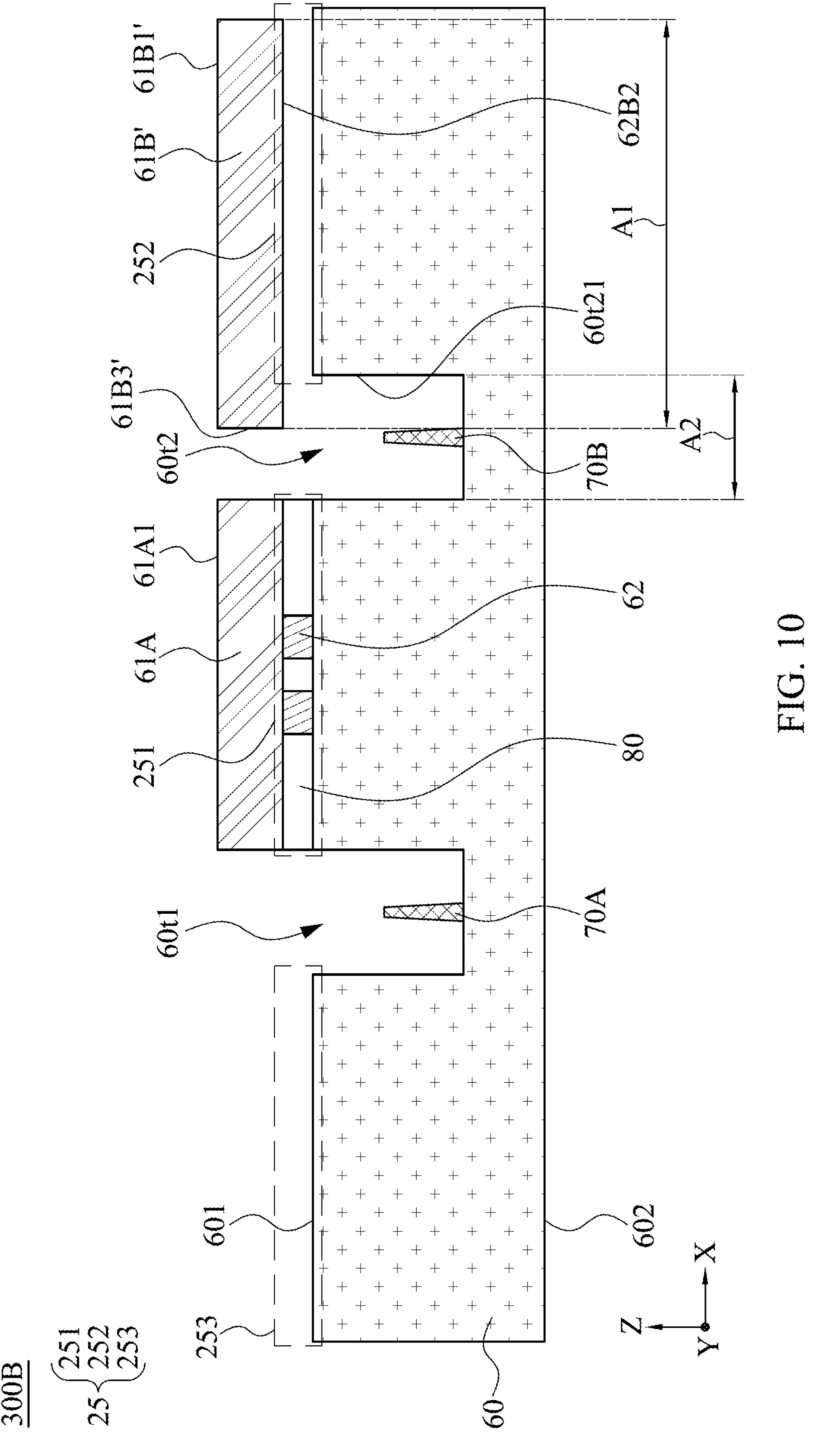
FIG. 10 is a cross-sectional view of an exemplary package structure according to some embodiments of the present disclosure.

FIG. 10 is a cross-sectional view of an exemplary package structure 300B according to some embodiments of the present disclosure. The package structure 300B of FIG. 10 is similar to the package structure 300A of FIG. 9. Some details may correspond to previous descriptions and are thus not repeated for brevity, with differences therebetween as follows.

The package structure 300B may include a semiconductor chip 61B' similar to the semiconductor chip 61B but having a lateral surface 61B3' misaligned with the lateral surface **60*t*21 of the trench 60*t*2. The semiconductor chip 61B' may have a projecting area A1 on the surface 601 of the carrier 60 and the trench 60*t*2 may have a projecting area A2 on the surface 601 of the carrier 60. The projecting area A2 may partially overlap the projecting area A1**.

Figure 11:
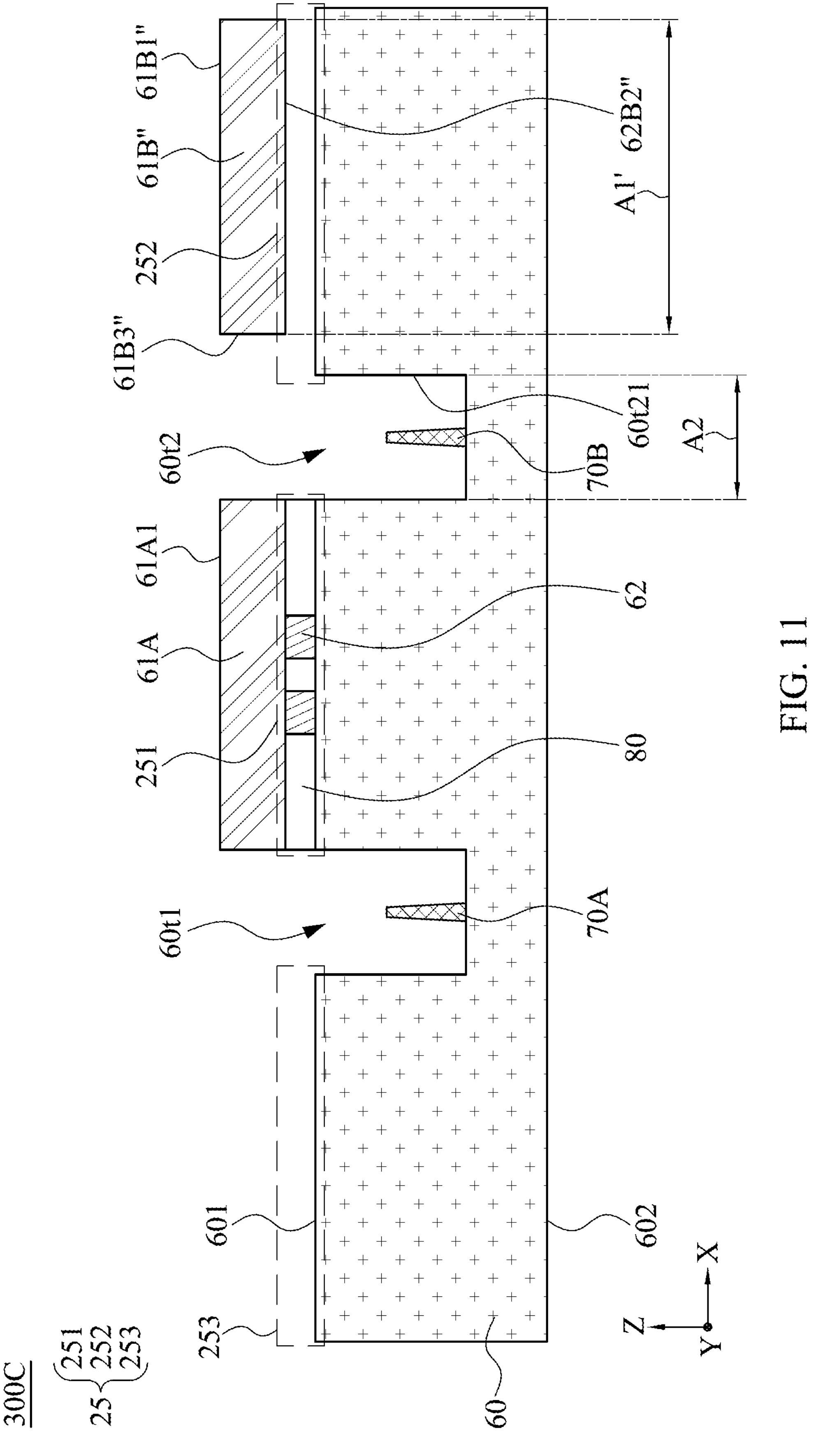
FIG. 11 is a cross-sectional view of an exemplary package structure according to some embodiments of the present disclosure.

FIG. 11 is a cross-sectional view of an exemplary package structure 300C according to some embodiments of the present disclosure. The package structure 300C of FIG. 11 is similar to the package structure 300A of FIG. 9. Some details may correspond to previous descriptions and are thus not repeated for brevity, with differences therebetween as follows.

The package structure 300C may include a semiconductor chip 61B" similar to the semiconductor chip 61B but having a lateral surface 61B3" misaligned with the lateral surface **60*t*21 of the trench 60*t*2. The semiconductor chip 61B" may have a projecting area A1' on the surface 601 of the carrier 60 and the trench 60*t*2 may have a projecting area A2 on the surface 601 of the carrier 60. The projecting area A2 may be non-overlapping with the projecting area A1**'.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
a first substrate;
a second substrate disposed under the first substrate;
a gap between the first substrate and the second substrate, wherein the gap comprises a first region and a second region, the first region is configured to accommodate a filling material; and
a directing structure disposed in a flow path of the filling material and configured to reduce a migration of the filling material from the first region to the second region,
wherein the second substrate comprises an upper surface facing the first substrate and a trench recessed from the upper surface of the second substrate, wherein the directing structure is disposed in the trench,
wherein the directing structure comprises a plurality of protrusions arranged in an array, and wherein the plurality of protrusions is staggered from a top view.

2. The package structure of claim 1, wherein the trench is configured to accommodate the filing material.

3. The package structure of claim 2, wherein the plurality of protrusions protrudes from an inner surface of the trench.

4. The package structure of claim 1, wherein the trench has a lateral surface and the plurality of protrusions extends in a direction non-parallel to the lateral surface of the trench from the top view.

5. The package structure of claim 1, wherein the plurality of protrusions comprises a first protrusion having a first width and a second protrusion having a second width different from the first width.

6. The package structure of claim 1, wherein the plurality of protrusions comprises a first protrusion having a first length and a second protrusion having a second length different from the first length.

7. The package structure of claim 1, wherein the plurality of protrusions extends in a direction non-parallel to the flow path from the top view.

8. A package structure, comprising:
a substrate;
a carrier disposed under the substrate and having a first upper surface facing the substrate;
a filling material disposed between the substrate and the first upper surface of the carrier, and
an adhesion enhancement structure disposed on the first upper surface of the carrier and configured to reduce an extent of delamination between the filling material and the first upper surface of the carrier,
wherein the adhesion enhancement structure comprises a plurality of protrusions having a cross-section tapering toward the substrate.

9. The package structure of claim 8, wherein the plurality of protrusions comprises a first protrusion and a second protrusion extending in different directions from each other from a top view.

10. The package structure of claim 8, wherein the plurality of protrusions comprises a first protrusion having a first height and a second protrusion having a second height different from the first height.

11. The package structure of claim 8, wherein the carrier comprises a trench recessed from the first upper surface and located under the substrate, and wherein the trench has an inner lateral surface extending non-parallel to a lateral surface of the protrusions.

12. A package structure, comprising:

a substrate comprising a first portion having a first value of flexural modulus and a second portion having a second value of flexural modulus smaller than the first value of flexural modulus;

a carrier disposed under the substrate;

a gap between the substrate and the carrier; and a directing structure disposed in the gap, wherein the directing structure is located between the first portion and the second portion of the substrate from a top view.

13. The package structure of claim 12, wherein the directing structure comprises a plurality of protrusions extending from the carrier toward the substrate.

14. The package structure of claim 13, further comprising a groove recessed from an upper surface of the carrier facing the substrate, wherein the protrusions are disposed in the groove.

15. The package structure of claim 12, further comprising a filling material in the gap, wherein the filling material is in contact with the first portion of the substrate and free from being in contact with the second portion of the substrate.

16. The package structure of claim 14, wherein the gap comprises a first region under the first portion of the substrate and a second region under the second portion of the substrate, and wherein the first region of the gap has a height greater than a second height of the second region of the gap.

* * * * *